United States Patent [19]

Watanabe et al.

[11] Patent Number: 5,610,435
[45] Date of Patent: Mar. 11, 1997

[54] SEMICONDUCTOR DEVICE HAVING AN ELECTRODE WHICH CONTROLS A SURFACE STATE OF THE BASE AREA FOR MINIMIZING A CHANGE OF THE D.C. AMPLIFICATION RATIO

[75] Inventors: Hidenori Watanabe, Hiratsuka; Junichi Hoshi, Hadano; Yutaka Yuge, Mishima; Akira Okita, Ayase; Hideshi Kuwabara, Zama, all of Japan

[73] Assignee: Canon Kabushiki Kaisha, Tokyo, Japan

[21] Appl. No.: 668,369

[22] Filed: Jun. 18, 1996

Related U.S. Application Data

[63] Continuation of Ser. No. 172,650, Dec. 23, 1993, abandoned.

[30]     Foreign Application Priority Data

Dec. 28, 1992  [JP]  Japan ..................... 4-358741

[51] Int. Cl.⁶ ..................... H01L 27/00; H01L 27/08; H01L 29/73
[52] U.S. Cl. ..................... 257/629; 257/587; 257/593; 257/632; 257/30; 257/39
[58] Field of Search ..................... 257/629, 587, 257/585, 593, 632, 30, 36–39

[56]         References Cited

U.S. PATENT DOCUMENTS

| 3,451,866 | 6/1969 | Mutter | 257/629 |
| 4,024,564 | 5/1977 | Shimada et al. | 257/629 |
| 4,857,976 | 8/1989 | Overhauser et al. | 257/629 |
| 5,028,973 | 7/1991 | Bajor | 257/593 |

FOREIGN PATENT DOCUMENTS

| 0061668 | 4/1983 | Japan | 257/587 |
| 0120830 | 5/1991 | Japan | 257/587 |

*Primary Examiner*—Sara W. Crane
*Assistant Examiner*—Alexander Oscar Williams
*Attorney, Agent, or Firm*—Fitzpatrick, Cella, Harper & Scinto

[57]         ABSTRACT

A bipolar transistor having a control electrode area of a semiconductor of a first conductive type, and first and second main electrode areas positioned in contact with the control electrode area and composed of a semiconductor of a second conductive type different from the first conductive type, comprises, for the purpose of preventing depletion of the surface of the control electrode area and suppressing or annulating the current generated in the surficial depletion area, an electrode for controlling the surface state of the control electrode area, positioned, across an insulation film, on the surface of the control electrode area including the vicinity of the junction between the control electrode area and the above-mentioned first main electrode area.

23 Claims, 22 Drawing Sheets

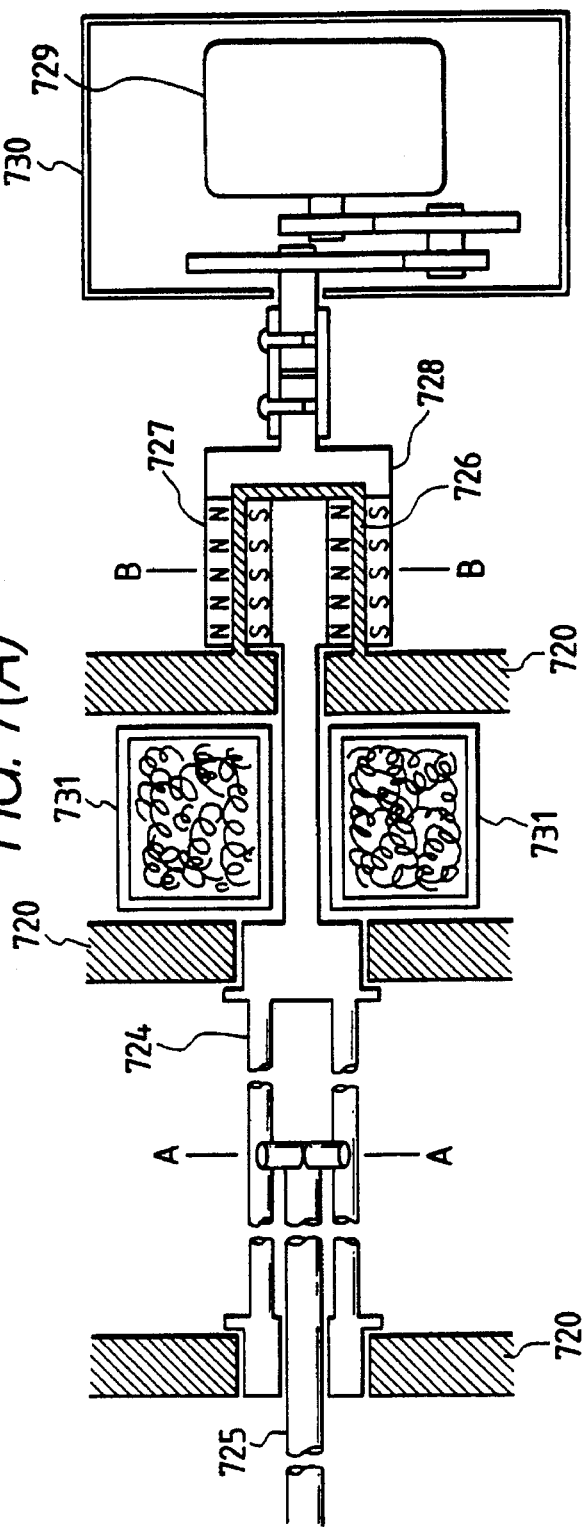
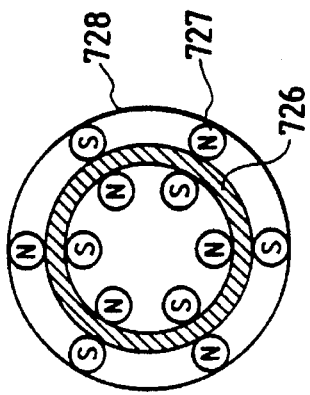
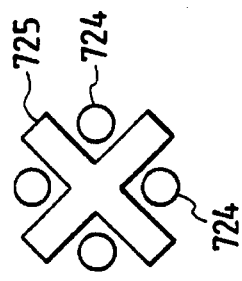

SEMICONDUCTOR DEVICE HAVING AN ELECTRODE WHICH CONTROLS A SURFACE STATE OF THE BASE AREA FOR MINIMIZING A CHANGE OF THE D.C. AMPLIFICATION RATIO

This application is a continuation of application Ser. No. 08/172,650 filed Dec. 23, 1993, which is now abandoned.

BACKGROUND OF THE INVENTION

1. Field of the Invention

The present invention relates to a semiconductor device, a method for making the same and an apparatus for making the same.

2. Related Background Art

One of the essential steps in the preparation of a semiconductor device is oxide film formation. The oxide film is generally formed by thermal oxidation. FIG. 1 illustrates a conventional apparatus for making the semiconductor device. Silicon wafers 701, from whose surface trace amounts of heavy metals and alkali metals present thereon are removed by acid treatment and deionized water with impurity content reduced to the lowest minimum, are placed on a boat 702 of highly pure quartz and are inserted into the central part of an oxidation oven, by means of a pulling rod 703 of highly pure quartz. Into a tube 704 of highly pure quartz, constituting the oxidation oven, there is introduced process gas 705, consisting of highly pure oxygen, a gaseous mixture obtained by combustion of hydrogen and oxygen, or a mixture of such oxidative gas and HCl. Said process gas 705 may be diluted with inert gas such as nitrogen, in order to control the oxidation rate. The tube 704 is heated by a heater 706 from the outside, and the central part is precisely temperature controlled. Between the tube 704 and the heater 706, there is inserted a line tube 707 of highly pure SiC, serving to prevent the contamination from the heater 706 to the tube 704 and to attain uniform and stable oven temperature. The silicon wafers 701, heated to about 800° to 1200° C., are thus oxidized by the process gas 705, whereby a thermally oxidized film is formed on the surface. The thickness of the thermal oxidation film is determined by the temperature of the oxidation oven, the composition, mixing ratio and dilution ratio of the process gas and the process time.

A scavenger 708 is provided to recover remaining gas 709 that has not contributed to oxidation, and to protect a clean bench area 710 from a large amount of heat liberated from the oxidation oven. A duct 711 for recovering the exhaust gas 709 is connected to the scavenger 708.

However, the film forming operation in the above-explained apparatus has been associated with a drawback of formation of a spontaneous oxide film, thereby deteriorating the characteristics of the prepared semiconductor device. The present inventors have made investigations for the cause of the above-mentioned drawback, and have obtained following knowledge:

(1) Conventionally, in order to suppress the heat liberated to the clean bench area 710, the gas suction by the duct 711 has been conducted strongly, in excess (for example in the order to several tens times larger) of the amount required for removing the exhaust gas 709. For this reason, in the popular open-tube oxidation oven, there is involved external air which generates spontaneous oxide film;

(2) Even if the gas exhaust by the duct 711 is suppressed, the oxidation employing gaseous mixture obtained by combustion of oxygen and hydrogen in the popular open-tube oxidation oven leads to the formation of a laminar flow, deteriorating the thickness distribution of the oxide film.

FIG. 2 shows the oxygen concentration at a position of 1 mm from the open end of a quartz tube of an internal diameter of 180 mm, when highly pure nitrogen almost free from moisture or oxygen is introduced, as a function of open or closed state of the scavenger duct. Other conditions are shown in FIG. 2.

According to FIG. 2, the oxygen concentration is 5.4% at a nitrogen flow rate of 10 l/min, when the scavenger duct is opened. Such oxygen concentration is extremely high, in consideration of facts that the oxygen concentration in the air is about 20% and that highly pure nitrogen is introduced into the quartz tube. These facts indicate a large involvement of the external air by the scavenger duct. FIG. 2 also indicates that such external air involvement can be prevented to a certain extent if the scavenger duct is closed, but such state is not practical because the temperature of the clean bench area is elevated.

On the other hand, a closed-tube configuration can prevent the external air involvement at the oxidizing operation. However, even in such closed-tube configuration, the oven becomes temporarily open at the insertion and extraction of the wafers, and the spontaneous oxide film is formed in the period until the wafers are inserted into the central part of the oven. Recent miniaturized semiconductor devices require a thickness of the gate oxide film not exceeding 100 Å, and the presence of such spontaneous oxide film affects the characteristics of the semiconductor devices.

On the other hand, in the conventional semiconductor devices, the orientation of a semiconductor at a junction interface of the metal-semiconductor contact is determined by the surface orientation of the semiconductor substrate, and the electrode are generally composed of the same metal as that employed for the wiring material.

However, lack of selection of the optimum surficial orientation of the semiconductor and of the optimum metal material has resulted in the following drawbacks in the manufacturing method and the function of the semiconductor devices:

(1) The crystalline character of the metal electrodes is affected by the surficial orientation of the semiconductor substrate; and (2) The current-voltage characteristics of the semiconductor-metal contact are determined by the surficial orientation of the semiconductor substrate and the electrode material.

Also, in the conventional semiconductor integrated circuits, there are provided wiring layers extending along the surface of the cells for electric connection of said cells, but such wiring layer is apt to cause disconnection at the step difference at the boundary between the cell and the exterior. The causes for such disconnection are the step difference in the height, at the boundary, between each cell and the surrounding area, and the halation induced by various highly reflective thin films present in the vicinity of said boundary of the cell.

Such disconnection has conventionally been prevented by improvements in the process, such as:

1) reduction of the step difference;

2) reduction in the reflectance of the thin films; and 3) use of photolithographic technology which is not affected by the halation. Although these measures are proper, they require complication and more precision in the process, thus inevitably resulting in an increased cost.

Also, since all the bipolar transistors formed on a same substrate have a substantially same emitter-grounded yield voltage, the yield voltage of all the bipolar transistors in the designing of a semiconductor device is determined by that of a bipolar transistor requiring the highest yield voltage.

However, in case of forming bipolar transistors belonging to two or more power sources on a same chip, the distance between the buried layer and the base, determining the above-mentioned yield voltage and the cut-off frequency of the bipolar transistors, has to be made large so as to match a higher power source voltage, so that the cut-off frequency of the bipolar transistors belonging to the power source of a lower voltage becomes inevitably low.

Also in case bipolar transistors are employed as analog amplifiers or in a photo sensor of bipolar configuration, there are required those showing little change in the current gain $H_{FE}$ over a wide collector current range.

However, the conventional bipolar transistors tend to show a larger variation in the current gain, resulting from a variation in the collector current, with the size reduction, so that it has been difficult to obtain the bipolar transistors showing little change in the current gain $H_{FE}$ over a wide range of collector current.

The above-mentioned drawback becomes particularly conspicuous in the bipolar transistor in which the injection of the minority carriers from the base area into the emitter area is suppressed in order to achieve a high-speed transistor function, a higher current amplification gain and a higher frequency limit.

This point will be explained further in the following, with reference to FIGS. 3 and 4. The base current $I_B$ of the bipolar transistor can be represented by the following equation:

$$I_B = I_{Bdiff} + I_{Brec} + I_{rec}$$

wherein:

$I_{Bdiff}$: diffusion current of positive holes injected from the base into the emitter;

$I_{Brec}$: recombination current of positive holes recombined inside the base; and $I_{rec}$: recombination current in the depletion area.

Among these components, $I_{Bdiff}$ and $I_{Brec}$ are related to the emitter-base voltage $V_{BE}$ in the following manner:

$$I_{Bdiff}, I_{Brec} \propto \exp(V_{BE}/KT)$$

while $I_{rec}$ is related in the following manner:

$$I_{rec} \propto \exp(V_{BE}/2KT)$$

wherein K is the Boltzmann constant and T is the temperature.

Also the collector current $I_C$ is related in the following manner:

$$I_C \propto \exp(V_{BE}/KT)$$

Since $I_{Bdiff} \gg I_{Brec}, I_{rec}$ in the conventional bipolar transistors, the collector current $I_C$ or the base current $I_B$, when represented by the ordinary logarithm as a function of the emitter-base voltage $V_{BE}$, assumes the form of a straight line of an inclination (log e)/KT as shown by solid lines in FIG. 3. In a high current region, however, the collector current and the base current are no longer proportional to the emitter-base voltage by the factor $\exp(V_{BE}/KT)$ because of conductance modulation and other effects.

The current amplification gain $H_{FE}$ of the bipolar transistor, being defined by $I_C/I_B$, is ideally constant regardless of the collector current.

In practice, however, with the size reduction of the bipolar transistor, the recombination current $I_{rec}$ in the depletion area becomes no longer negligible with respect to the diffusion current $I_{Bdiff}$ of the positive holes injected from the base into the emitter, and the base current, being affected by a component proportional to $\exp(V_{BE}/2KT)$ as represented by a broken line in FIG. 3, assumes the form of a curved line as indicated by a chain line therein. The current amplification gain, being defined by $I_C/I_B$ as mentioned above, becomes lower in such case in a region where the collector current is low.

In order to reduce such current gain dependence of the collector current $I_C$, $I_{rec}$ has to be suppressed at a low level.

Also the aforementioned bipolar transistor in which the injection of the minority carriers from the base area into the emitter area is suppressed is apt to be affected by the recombination current $I_{rec}$ in the depletion area because the diffusion current $I_{Bdiff}$ of the positive holes injected from the base into the emitter is small, so that the control of the recombination current $I_{rec}$ in the depletion area is essential for reducing the current gain dependence of the collector current $I_C$.

Examples of such bipolar transistor in which the injection of the minority carriers from the base area into the emitter area is suppressed include:

(1) a semiconductor device provided with a thin film capable of passing the tunneling current and a polycrystalline layer laminated on said thin film and constituting an energy gap with the emitter area for suppressing or inhibiting the injection of the minority carriers, wherein the thickness of the emitter area is selected smaller than the diffusion length of the minority carriers; and (2) a semiconductor device employing microcrystals or an amorphous semiconductor as the emitter area and an energy band gap of the emitter area wider than that of the base area.

In the following there will be explained, with reference to FIG. 4, why the recombination current $I_{rec}$ in the depletion area becomes not negligible with the size reduction of the bipolar transistor. FIG. 4 is a cross-sectional view of a bipolar transistor, in the vicinity of the emitter area thereof.

In FIG. 4 there are shown a collector area 101 constituting a second main electrode area of a second conductive type; a base area 102 constituting a control electrode area of a first conductive type; an emitter area 103 constituting a first main electrode area of the second conductive type; a lead electrode 104, composed of Al or polysilicon, for the emitter area; and an insulation film 105 composed for example of silicon oxide. In the transistor of such configuration, a depletion area 106 of a metallurgic junction in nature is formed in the vicinity of the junction between the base area 102 and the emitter area 103, and a surfacial depletion area 107 is formed in the vicinity of the interface between the base area 102 and the insulation film 105.

Said surfacial depletion area 107 is formed for example by the fixed charge and the movable ionic charge in the insulation film 105, the trapped charge at the interface between the insulation film 105 and the base area 102, and the difference in work function between the electrode 104 formed on the insulation film 105 and the base area 102.

The above-mentioned recombination current $I_{rec}$ in the depletion area is generated in the depletion area 106 of metallurgic junction and the surfacial depletion area 107.

In the aforementioned equation, the diffusion current $I_{Bdiff}$ of the positive holes injected from the base into the emitter and the recombination current $I_{rec}$ of the positive holes recombined in the base area are respectively proportional to the size of the emitter area.

On the other hand, within the recombination current in the depletion area, that generated in the depletion area of metallurgic junction is proportional to the size of the emitter area, but that generated in the surfacial depletion area is not proportional to said size.

Consequently, along with the size reduction of the transistor or the emitter area thereof, the recombination current generated in the surfacial depletion area occupies a larger proportion in the base current.

For this reason, in order to suppress the recombination current $I_{rec}$ in the depletion area, it is necessary to control the recombination current generated in the surfacial depletion area.

Said recombination current generated in the surfacial depletion area can be almost completely eliminated by surface state control so as not to form the depletion area at the surface of the semiconductor substrate.

Stated differently, in order to reduce the collector current dependence of the current amplification gain of the bipolar transistor, the surface state of the semiconductor substrate has to be controlled.

SUMMARY OF THE INVENTION

An object of the present invention is to provide an apparatus for producing the semiconductor device, capable of controlled formation of the oxide film.

Another object of the present invention is to provide a semiconductor device having an electrode material of excellent electric properties.

Still another object of the present invention is to provide a semiconductor device having a wiring structure not inducing disconnection of the wiring layer and not involving complication in the process.

Still another object of the present invention is to provide a semiconductor device capable of showing excellent electric properties even when elements of different power source voltages are integrated.

Still another object of the present invention is to provide a semiconductor device capable of controlling the surface state of the base area, thereby suppressing the recombination current in the surfacial depletion area and achieving little variation in the current amplification gain over a wide collector current region.

Still another object of the present invention is to provide a semiconductor device capable of resolving the drawback of wiring disconnection at the step difference, employing the known process, without involving complication or higher precision therein.

Still another object of the present invention is to provide a semiconductor device provided, in a semiconductor substrate, with a control electrode area of a semiconductor of a first conductive type, and first and second main electrode areas formed in contact with said control electrode area and composed of a semiconductor of a second conductive type different from said first conductive type, said semiconductor device comprising an electrode, for controlling the surface state of the control electrode area, formed across an insulation film on the surface of said control electrode area including the vicinity of the junction between said main electrode area and said control electrode area.

Still another object of the present invention is to provide a method for producing the above-mentioned semiconductor device, in which said electrode for controlling the surface state of the control electrode area is used as a mask for impurity introduction at the formation of the first main electrode area.

Still another object of the present invention is to provide a semiconductor device provided with an electrical connecting part in which an electric connection is achieved by a mutually contacting arrangement of a semiconductor area and a metal, wherein said metal material is selected corresponding to the conductive type and the surfacial orientation of the connecting surface of said semiconductor area.

Still another object of the present invention is to provide an apparatus for producing a semiconductor device, comprising an oven member, a clean bench area, a tube connecting said oven member and said clean bench area and closed at least at the side of said clean bench area, and power transmission means for effecting wafer insertion into and extraction from the oven member, within said tube.

Still another object of the present invention is to provide a semiconductor device in which plural cells are arranged with a regular pattern, each cell is connected to an adjacent cell by a wiring layer and said wiring layer extends to the outside of said pattern, wherein the layout of said wiring layer is made different at the boundary between said cell pattern and the outside from that in other part, for example said wiring layer is made thicker at said boundary. In said semiconductor device, said wiring layer at said boundary may be extracted obliquely with respect to the plane of said boundary, or may be connected at said boundary to a wiring layer present below a high reflective thin film present in said cell, or may be divided into upper and lower two layers at the boundary.

Still another object of the present invention is to provide a semiconductor device comprising a dummy cell positioned adjacent to the cell at the boundary and having such a thickness capable of reducing the step difference in height to said cell, or a dummy cell positioned adjacent to the cell at the boundary and not containing the highly reflective pattern present in said cell.

Still another object of the present invention is to provide a semiconductor device having a bipolar transistor including an emitter of a first conductive type, a base of a second conductive type and a collector of the first conductive type, wherein, within an area of the first conductive type of a high inpurity concentration formed for reducing the collector resistance in said collector area, the size directly below the base is smaller than the size of said base.

BRIEF DESCRIPTION OF THE DRAWINGS

FIG. 7A is a schematic view of a rotary shaft, in the apparatus for producing semiconductor device, embodying the present invention, and FIGS. 7B and 7C are cross-sectional views thereof;

DETAILED DESCRIPTION OF THE PREFERRED EMBODIMENTS

Now the present invention will be clarified in detail by preferred embodiments thereof shown in the attached drawings.

The apparatus for producing semiconductor device, to be explained in the following, is provided with an oven body, a clean bench area, a closed tube extending between said oven body and said clean bench area, and power transmission means for effecting wafer insertion into and extraction from said oven body within said closed tube, and enables to move the wafers in said closed tube by means of said power transmission means and to effect cleaning and heating inside said closed tube, thereby achieving oxide film formation without the influence of external air involvement.

Also the method for producing semiconductor device, to be explained in the following, effects the wafer insertion into and extraction from the oven body within the closed tube, thereby achieving oxide film formation without the influence of external air involvement.

(Embodiment 1)

Figure 1:
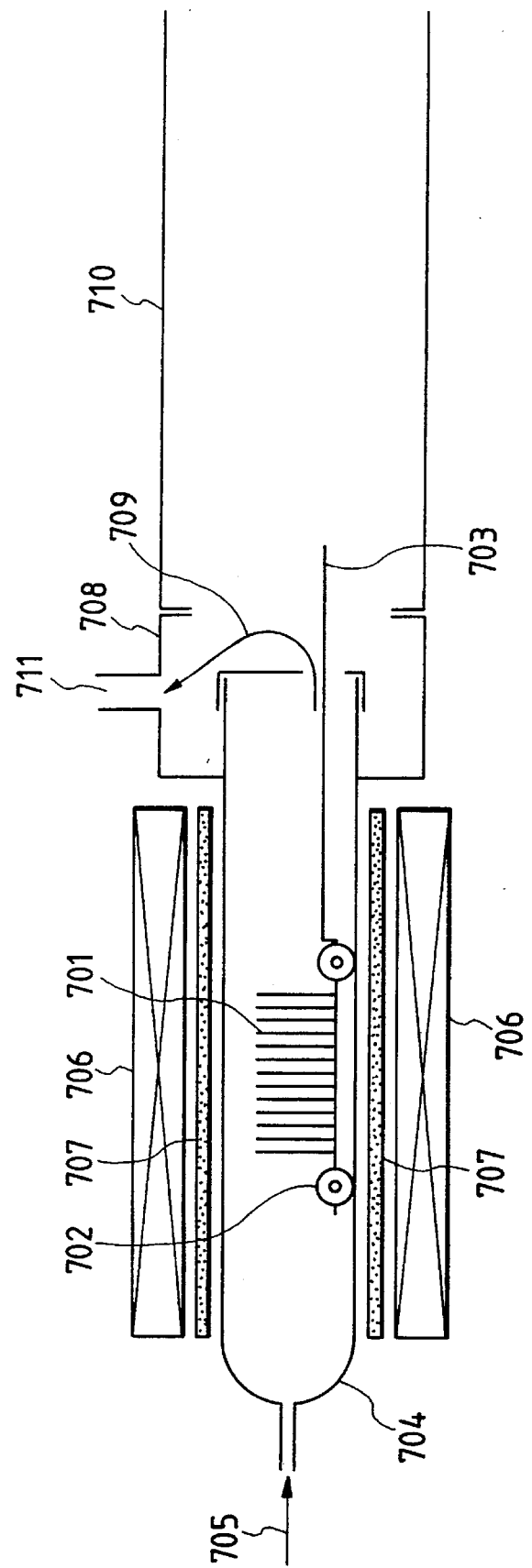
FIG. 1 is a schematic view of a conventional horizontal apparatus for producing semiconductor device.
Figure 2:
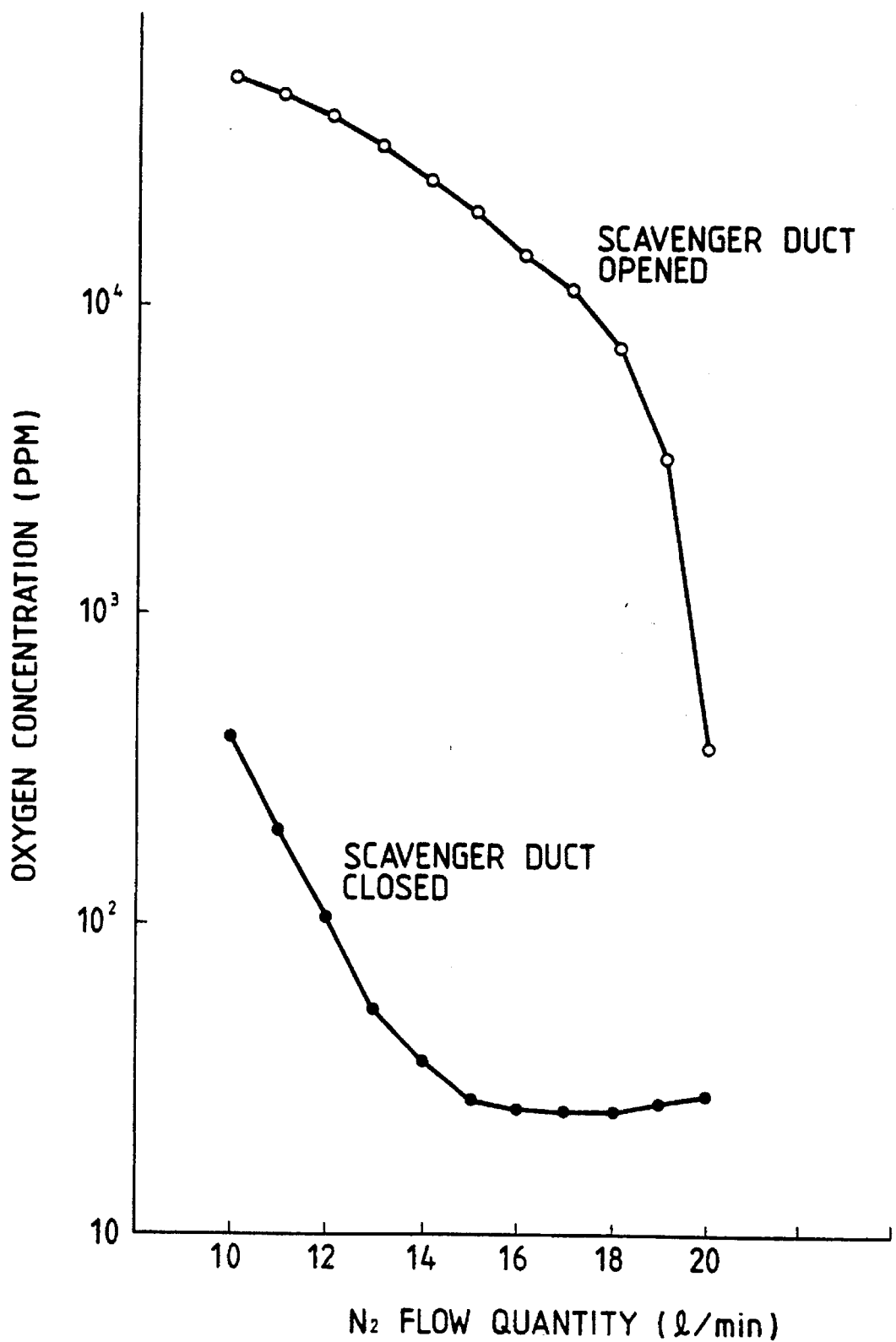
FIG. 2 is a chart showing the oxygen concentration when highly pure nitrogen is passed in the apparatus shown in FIG. 1, in cases where the scavenger duct is opened or closed.
Figure 3:
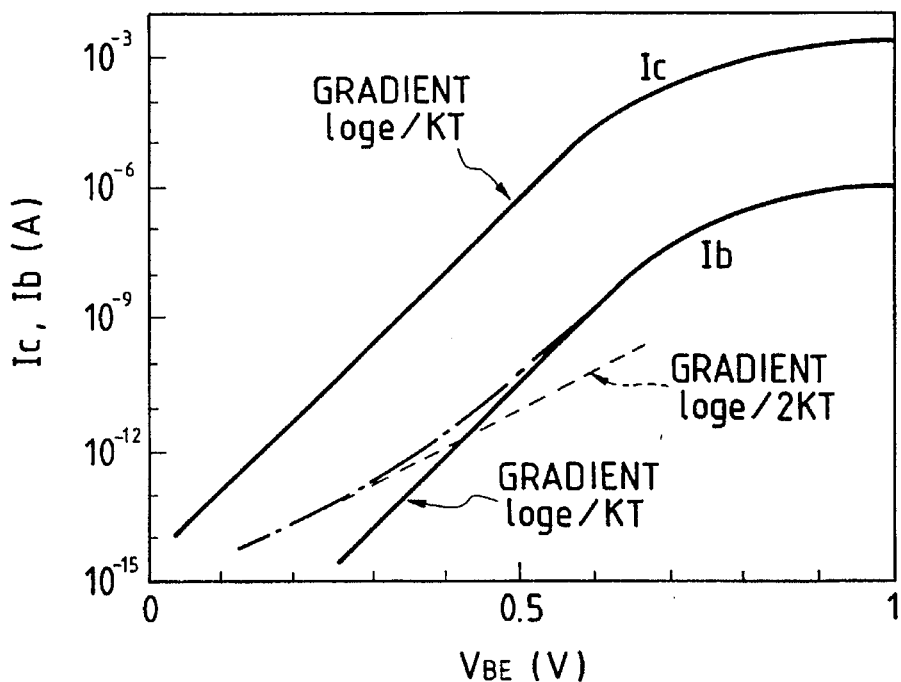
FIG. 3 is a characteristic chart showing the collector current $I_C$ and the base current $I_B$ of a bipolar transistor as a function of the emitter-base voltage $V_{BE}$.
Figure 4:
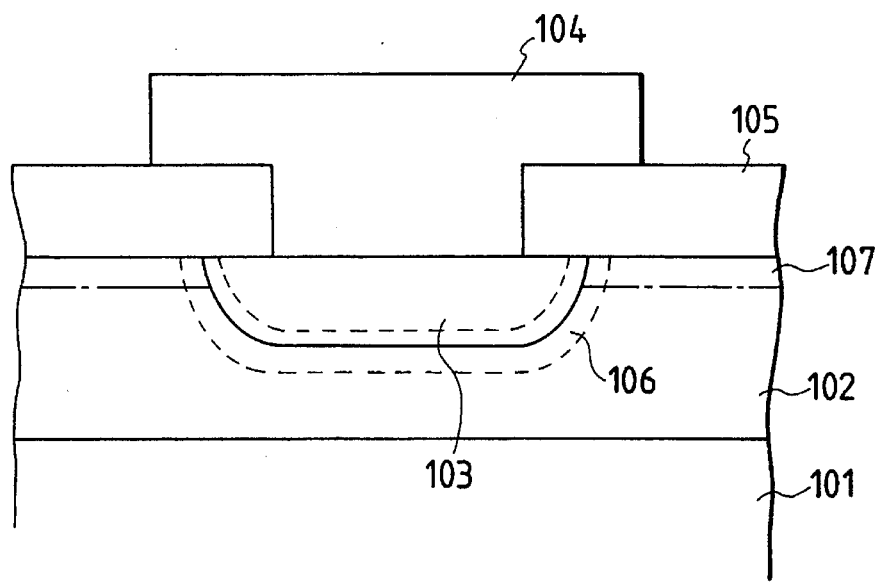
FIG. 4 is a cross-sectional view of a bipolar transistor in the vicinity of the emitter area thereof.
Figure 5:
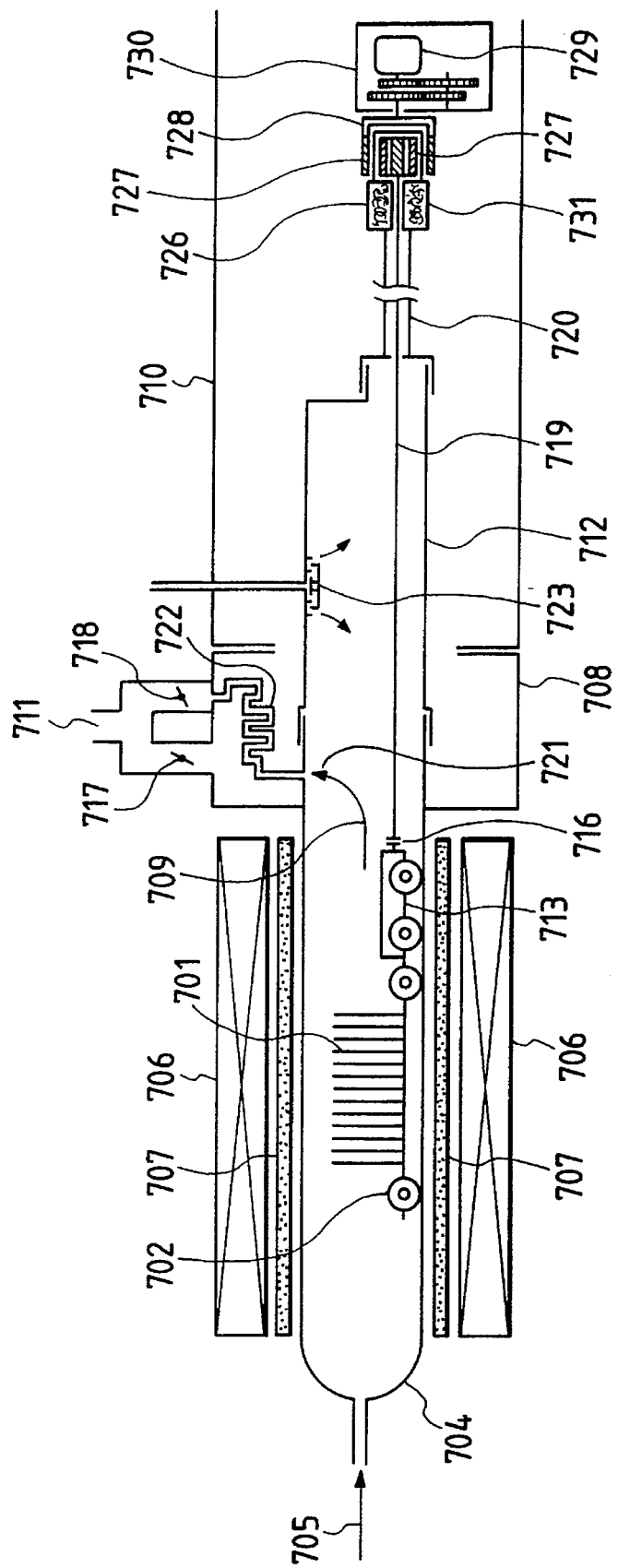
FIG. 5 is a schematic view of a first embodiment of the apparatus of the present invention for producing semiconductor device.

FIG. 5 is a schematic view showing a first embodiment of the apparatus of the present invention for producing semiconductor device. In the following reference is made to FIG. 5 for explaining the configuration of said apparatus and the process of oxidation of silicon wafers by means thereof.

Figure 6A:
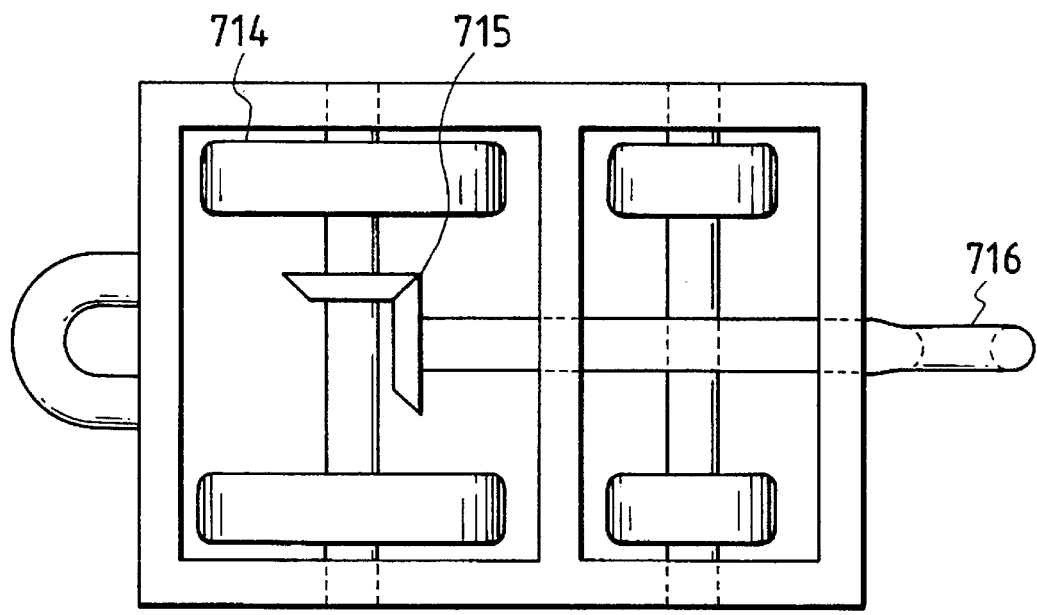
FIGS. 6A and 6B are schematic views of a driving cart for the apparatus for producing semiconductor device, embodying the present invention.
Figure 6B:
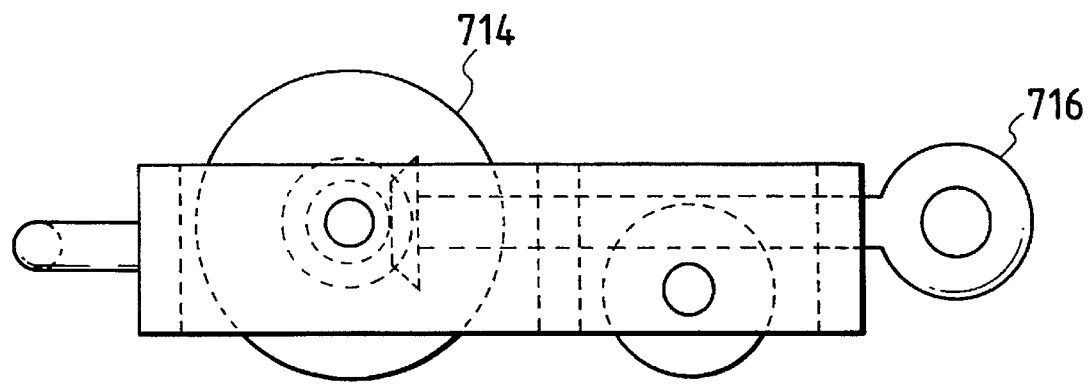

At first, cleaned silicon wafers 701 are placed on a boat 702 of highly pure quartz, in a clean bench area 710. The boat 702 is inserted into a long cap 712 of highly pure quartz, and is connected to a driving cart 713 in said long cap 712. Said long cap 712 is used for the purpose of reducing the external air involvement. The driving cart 713 is also entirely made of highly pure quartz. FIGS. 6A and 6B are respectively a plan view and a lateral view of said driving cart 713. Driving wheels 714 are connected to a bevel gear 715, and are rotated by a rotating power given to a joint 716.

Then a damper A717 provided in a duct 711 of a scavenger 708 is so adjusted to obtain a minimum necessary exhaust amount. The long cap 712 is fitted to a tube 704, then the joint 716 is connected, and a rotary shaft 719 is fitted into the long cap 712. The rotary shaft 719 is surrounded by a cover 720 of highly pure quartz, so that an oxidation oven of closed-tube configuration is formed. Exhaust gas 709 is recovered from a suction hole 721, formed at the aperture side of the tube 704. Since the temperature of said exhaust gas 709 is as high as 400° C. or even higher, though variable depending on the process temperature, a cooling baffle 722 of highly pure quartz is provided in front of the duct 711. Said cooling baffle 722 also serves to prevent external air involvement from the duct 711. Also the long cap 712 is provided with a gas introducing hole 723, which is so designed in shape as not to raise the particles such as quartz powder in the long cap 712 at the gas introduction. The introduced gas is composed of inert nitrogen gas, which is introduced in a very small amount at the beginning and is then gradually increased in the flow rate, in order to avoid particle deposition onto the silicon wafers 701.

The silicon wafers 701 were placed for more than 20 minutes in the long cap 712, in order to replace moisture, sticking in molecular level on the wafer surface with nitrogen.

FIG. 7A is a detailed view of the rotary shaft 719, which is composed of a fixed shaft 724 capable solely of rotation, and a telescoping shaft 725 capable of varying length as well as rotation. FIG. 7B is a cross-sectional view thereof taken along the lines A—A; and FIG. 7B is a cross-sectional view thereof taken along the lines B—B. At an end of the fixed shaft 724 there is mounted at cylinder 726, in which a permanent magnet 727 is embedded. Outside said cylinder, there is provided an external cylinder 728 containing an opposed permanent magnet 727 and connected to a geared motor 729 with a reducing mechanism, whereby the rotary power can be introduced without disturbing the atmosphere in the tube 704 including the long cap 712 (without involving the external air). A motor cover 730 is provided for preventing contamination of the clean bench area 710. A heat insulating block 731 is provided for intercepting the heat radiating from the oxidation oven. Otherwise the permanent magnets 727 provided in the cylinder 726 and the external cylinder 728 are heated, whereby the magnetic force is weakened and the rotating force cannot be transmitted. The heat insulating block 731 is filled with quartz wool. The rotary shaft 719 is also made of highly pure quartz, except for the permanent magnet 727.

When the motor 729 is activated, the rotation is transmitted to the driving wheels 714, whereby the driving cart 713 and the boat 702 start to run. The running speed is controlled by the rotating speed of the motor 729. The position of the boat 702 is optically detected at an end of the telescoping shaft 725, opposite to the joint.

After the boat 702 is moved to the central part (uniform temperature area) of the oven body, nitrogen introduction from the gas introduction hole 723 is terminated, and oxidation is effected by a predetermined process. Subsequently the interior of the tube 704 and the long cap 712 is sufficiently replaced with nitrogen.

Then the motor 729 is rotated in a direction opposite to that at the wafer insertion into the oven body, thereby moving the boat 702 to the end of the long cap 712 (wafer extraction). After the silicon wafers 701 are cooled for more than 20 minutes to a temperature at which the wafers 701 are not longer affected by the exposure to the external atmosphere, the wafers 701 are recovered by detaching the rotary shaft 719 and the long cap 712 and extracting the boat 702.

In the period of the steps of fitting of the long cap 712 to the tube 704, wafer insertion, oxidation, annealing, wafer extraction, and detachment of the long cap 712 from the tube 704, the sum of the amount of the process gas and the total amount of nitrogen gas, introduced from the gas introduction hole 723 into the long cap 712, was maintained constant. Also a damper B718 was so regulated that the flow rate of the exhaust gas 709 in the suction hole 721 is equal to 1.1 times, in the open-tube state, of said sum.

The thickness of the spontaneous oxide film formed in the apparatus of this embodiment was investigated. Also a MOS diode was prepared by forming a thin oxide film with the apparatus and the method of this embodiment. The obtained results are shown in Table 1.

TABLE 1

| | | Conventional example | Embodiment 1 | Embodiment 2 |
|---|---|---|---|---|
| Thickness of spontaneous oxide film | | 27 Å | 2.1 Å | 2.9 Å |
| Inter- facial level density | 800° C., dry $O_2$ 150 Å | $2.4 \times 10^{11}$ $ev^{-1}cm^{-2}$ | $1.1 \times 10^{10}$ $ev^{-1}cm^{-2}$ | $9.8 \times 10^{9}$ $ev^{-1}cm^{-2}$ |
| | 800° C., $H_2/O_2$ 200 Å | $8.2 \times 10^{10}$ $ev^{-1}cm^{-2}$ | $4.7 \times 10^{9}$ $ev^{-1}cm^{-2}$ | $3.9 \times 10^{9}$ $ev^{-1}cm^{-2}$ |
| Barrier height | | 3.2–3.3 eV | 3.3–3.4 eV | 3.3–3.4 eV |
| Average insulation voltage | 800° C., $H_2/O_2$ 200 Å | 8.1 MV/cm | 9.3 MV/cm | 9.5 MV/cm |

The thickness of the spontaneous oxide film was determined by completely eliminating the oxide on the wafer surface by rinsing, inserting the wafer into the central part of the oven in nitrogen atmosphere at an oven body temperature of 800° C., elevating the oven body temperature to 1000° C., then effecting treatment at 1000° C. for 60 minutes, then lowering the temperature to 800° C. and extracting the wafer from the oven. The interfacial level density was determined by the quasistatic C-V method. The barrier height was calculated from the Fowler-Nordheim plotting obtained from the DC I-V characteristics. The average insulation voltage was determined by the voltage at a current of 1 μA as the insulation breakdown voltage, averaged over 224 locations uniformly distributed within the wafer. The electrode area was $9 \times 10^{-3}$ cm$^2$. As will be apparent from Table 1, the formation of the spontaneous oxide film, resulting from the external air involvement and unavoidable in the conventional case, could be prevented. Also the obtained oxide film was superior in characteristics to that formed in the conventional example.

(Embodiment 2)

Figure 8:
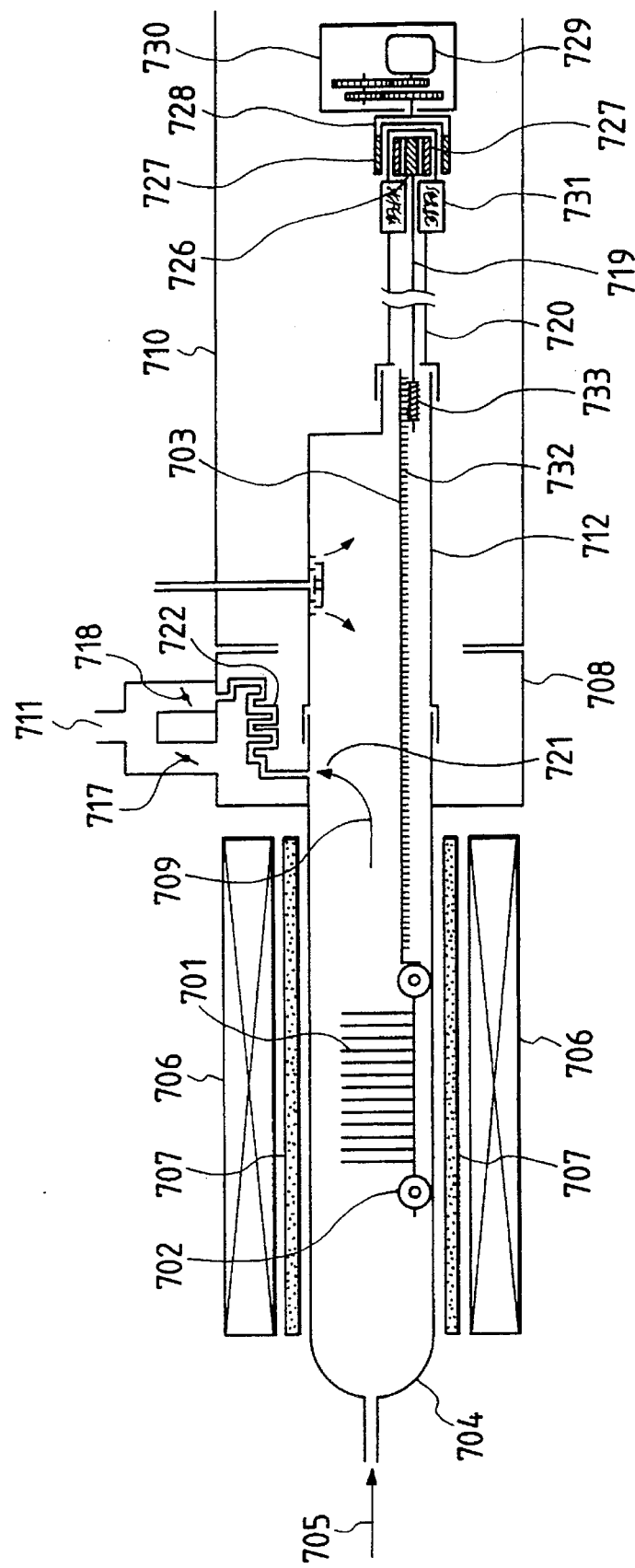
FIG. 8 is a schematic view showing another embodiment of the apparatus of the present invention for producing semiconductor device.

FIG. 8 is a schematic view of a second embodiment of the apparatus of the present invention for producing the semiconductor device, in which the driving cart is replaced by a traction rod 703 for insertion and extraction of the boat. Said traction rod 703 is provided with rack teeth, and is moved by the rotation of a pinion gear 733. The apparatus of the present embodiment is simpler in structure, in comparison with that of the embodiment 1.

The apparatus of the present embodiment provided, in the evaluation of the thickness of the spontaneous oxide film and in the evaluation of the MOS diode obtained by a thin oxide film prepared by the apparatus and the method of the present embodiment, comparable results to those of the embodiment 1, as summarized in Table 1.

In the semiconductor device to be explained in the following, in which electrical connection is attained by a mutually contacting arrangement of a semiconductor area and a metal, an improvement in the performance is achieved by selection of said metal material, corresponding to the conductive type of said semiconductor area and the surfacial orientation of the connecting surface of said semiconductor area.

(Embodiment 3)

Figure 9A:
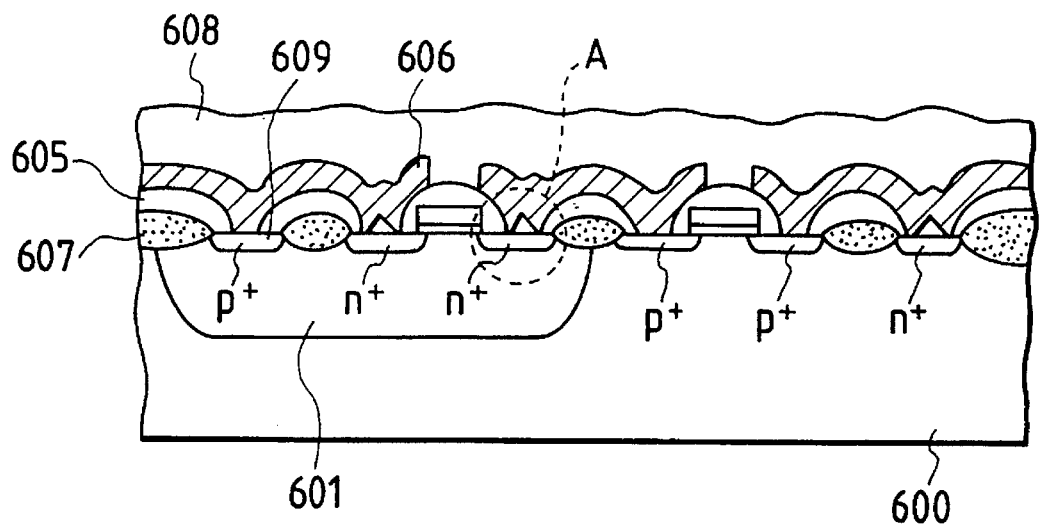
FIGS. 9A and 9B are respectively schematic cross-sectional views of an embodiment of the semiconductor device of the present invention, and a magnified view of an area A in FIG. 9A.
Figure 9B:
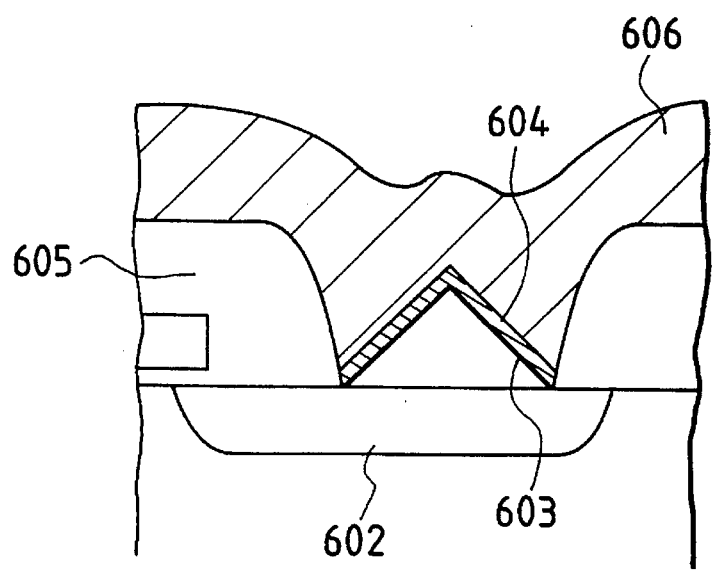

FIG. 9A is a schematic cross-sectional view of a 1st embodiment of the semiconductor device of the present invention. It shows the cross section of a CMOS transistor and best represents the feature of the present invention. FIG. 9B is a partial magnified view of an area A of FIG. 9A.

In these drawings there are shown a (100) Si substrate 600; a P-well 601; an n$^+$ diffusion layer 602; an n$^+$ contact area 603 having a (111) surface; a thin Ti film 604; a PSG film 605; an Al wiring 606; a field oxide film 607; and a passivation film 608. The contact between a p$^+$ layer 609 and the Al wiring 606 is made in the conventional manner.

The advantage of the present invention in the configuration shown in FIGS. 9A and 9B lies in a fact that the Shottky barrier between the n$^+$ layer 602 and the metal electrode (thin Ti film) 604 can be made smaller than in the ordinary Al-n(100)Si contact.

Table 2 summarizes the Shottky barrier heights of Al, Cu and Ti of n and p types, in combination with (100) Si and (111) Si.

TABLE 2

|  | (100) Si | | | (111) Si | | |
| --- | --- | --- | --- | --- | --- | --- |
|  | Al | Cu | Ti | Al | Cu | Ti |
| $\phi_{bn}$ n-type (eV) | 0.837 | 0.680 | 0.551 | 0.821 | 0.727 | 0.528 |
| $\phi_{bp}$ p-type (eV) | 0.303 | 0.470 | 0.607 | 0.319 | 0.506 | 0.634 |

For reducing the contact resistance, there is to be employed a combination of the substrate orientation and the metal showing a small Shottky barrier height $\phi_b$. From Table 2 it will be understood that, among the combinations between Al, Cu, Ti and (111)Si, (100)Si, smallest Shottky barrier height can be obtained by the combination:

Ti/(111)Si for n-type silicon; and

Al/(100)Si for p-type silicon.

(Embodiment 4)

Figure 10:
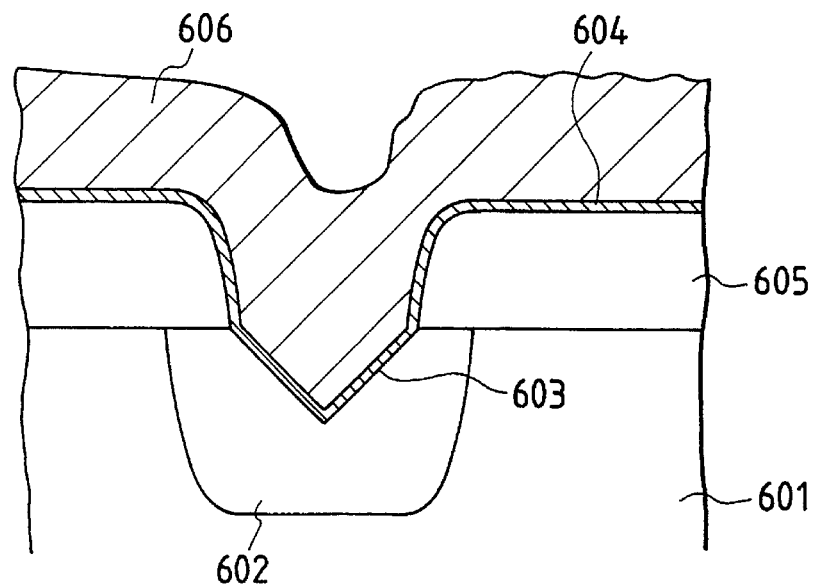
FIG. 10 is a schematic cross-sectional view of another embodiment of the semiconductor device of the present invention.

FIG. 10 is a schematic cross-sectional view of a 2nd embodiment of the semiconductor device of the present invention, wherein shown area a P-well area 601 formed in a (100)Si Substrate; an n⁺ layer 602; a (111)Si surface 603; a thin Ti film 604; and a PSG film 605. In contrast to the (111) surface of the connecting part in the 1st embodiment formed by pyramidal growth of Si, the connecting part in the present embodiment is formed, as shown in FIG. 10, by a V-sectioned groove obtained by etching. In this case a (111) surface can be easily obtained for example by KOH etching on the (100)Si substrate.

(Embodiment 5)

Figure 11:
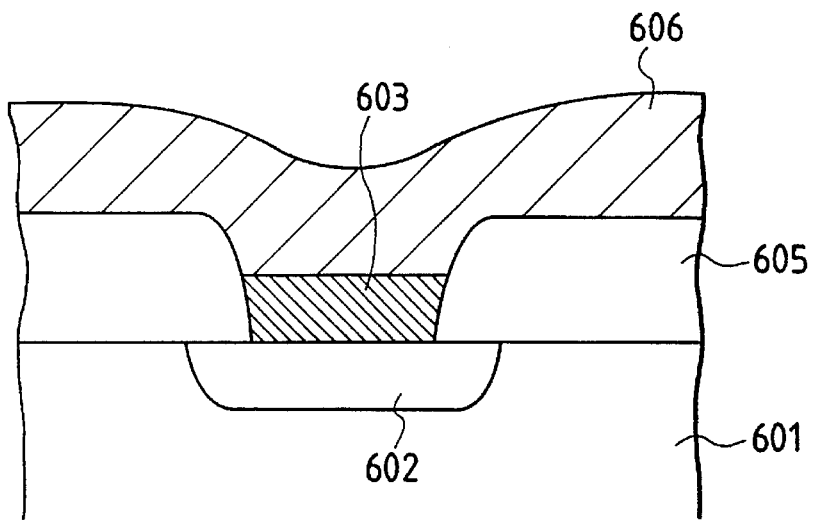
FIG. 11 is a schematic cross-sectional view of still another embodiment of the semiconductor device of the present invention.

FIG. 11 is a schematic cross-sectional view of a 3rd embodiment of the semiconductor device of the present invention, featured by formation a Si plug 603 having a (111) surface parallel to a (100) surface of a P-well area 601 provided in a (100)Si substrate. The crystalline character of Al is superior in the contact between Al wiring 606 and (111)Si 603 than in the contact between Al wiring 606 and (100)Si. Aluminum shows (111) orientation in such case, and the thermal stability becomes higher as the crystallinity of Al is higher. It is thus rendered possible to suppress the junction break in the alloying step.

The semiconductor device to be explained in the following can resolve the drawback of breakage of the wiring layer at the step difference by means of certain changes in the designing, without major change in the process for producing the integrated circuit. Consequently there are not required the period and the cost for developing a new process, and there is not involved the increase in the running cost at the mass production.

(Embodiment 6)

Figure 12:
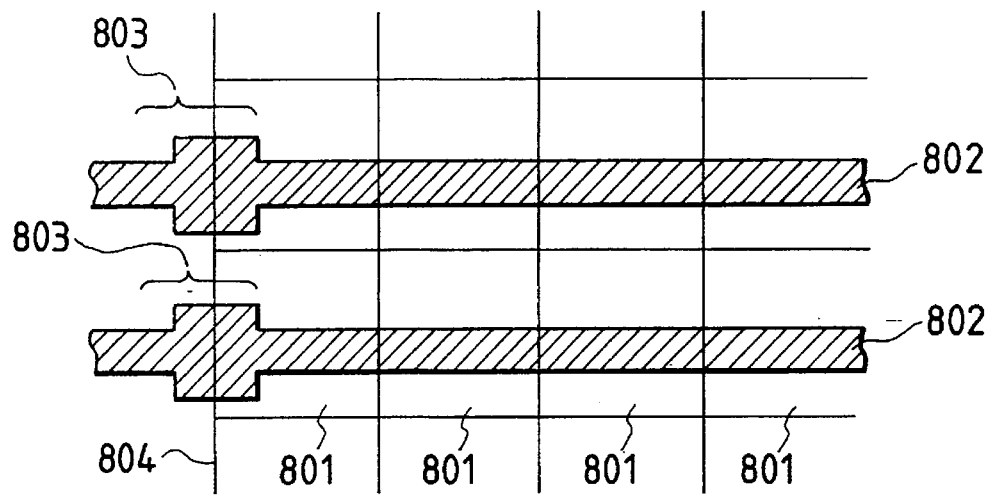
FIGS. 12 to 15 are partial plan views of an integrated circuit in other embodiments of the present invention.

In FIG. 12 showing an embodiment of the present invention, there are shown cells 801 arranged in mutually adjacent manner in the vertical and horizontal directions; plural wiring layers 802 extending in mutually parallel manner over the cells 801; and a boundary line 804 between a pattern area constituted by the cells 801 and the exterior, where a large step difference is usually formed. The wiring layer 802 is provided with a wider portion 803 in a position across said boundary line 804. Stated differently, the wiring layer 802 crosses the step difference extending along the boundary line 804 by the wider portion 803, whereby the disconnection of the wiring layer by said step difference can be prevented.

(Embodiment 7)

Figure 13:
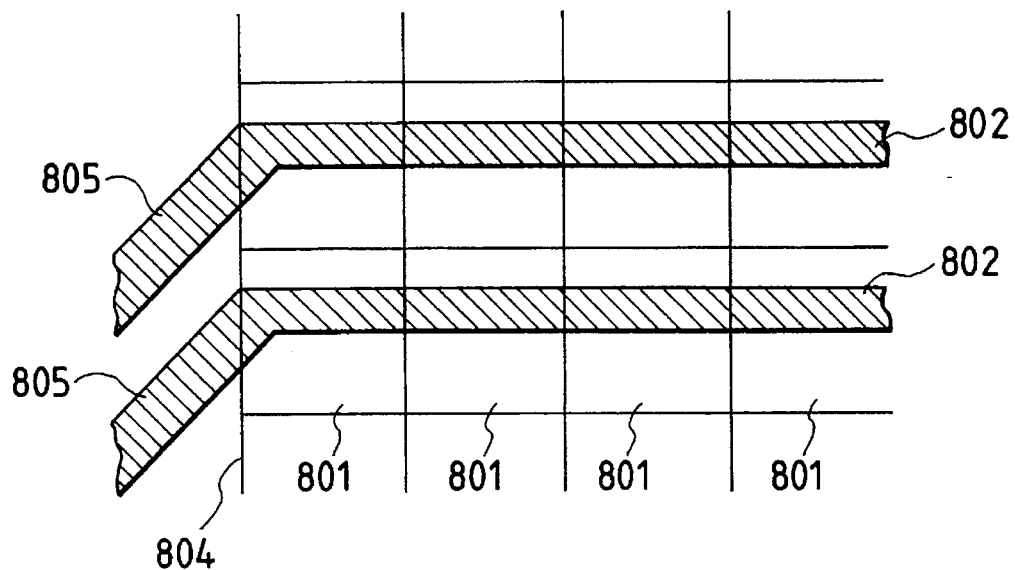

FIG. 13 shows a 2nd embodiment of the wiring layer of the present invention. In the present embodiment, the wiring layer 802 is provided with a portion 805 which diagonally crosses the boundary line 804. In this manner the wiring layer 802 has a larger effective line width, whereby obtained is an effect similar to that of the embodiment 6 shown in FIG. 12.

(Embodiment 8)

Figure 14:
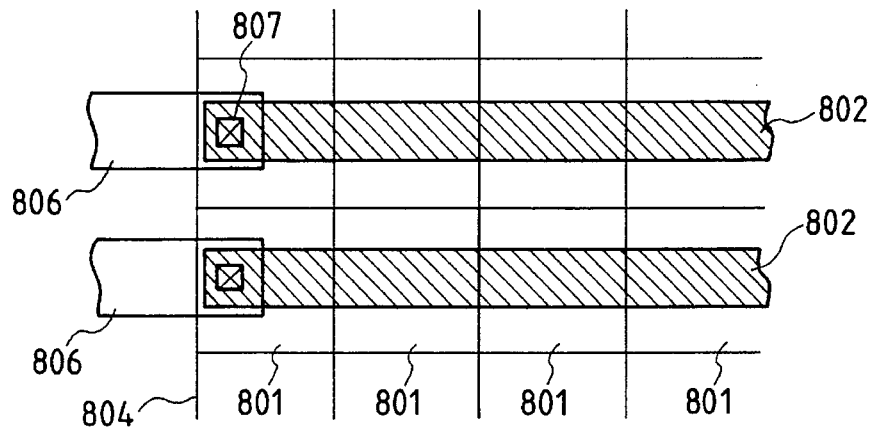

FIG. 14 shows a 3rd embodiment of the wiring layer of the present invention. In the present embodiment, the wiring layer 802 is connected, in a cell 801 adjacent to the boundary line 804, to a diffusion layer or a polysilicon layer 806 which passes beneath a highly reflective layer, such as of aluminum, through a contact hole 807. This embodiment allows to disregard the halation on a highly reflective layer such as of aluminum.

As a variation of this embodiment, the wiring layer 802 extending over the cells may be branched, prior to reaching the boundary line 804, to another wiring layer for example of a diffusion layer or a polysilicon layer, whereby said boundary line is crossed by two wiring layers.

(Embodiment 9)

Figure 15:
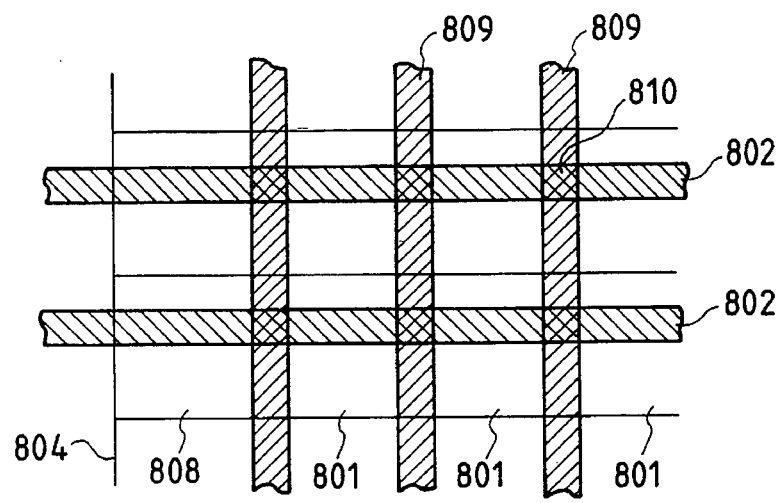

In a 4th embodiment of the wiring layer of the present invention shown in FIG. 15, dummy cells 808 different from ordinary cells 801 are formed outside the outermost positioned cells 801, and the boundary line 804 is formed at the external edge of said dummy cells 808. There are also provided other plural wiring layers 809 which extend in mutually parallel manner and cross the wiring layers 802 at crossing points 810. The disconnection by the step difference tends to appear most frequently in the crossing portion of the wiring layer 802 and another wiring layer 809 on the boundary line 804, but such disconnection of the wiring layer 802 on the boundary line 804 does not occur by the formation of the dummy cell 808, because said crossing point 810 does not exist on the boundary line 804.

As an unrepresented variation, there may also be employed a structure in which the highly reflective pattern present in each cell is eliminated in the dummy cell. Such structure enables to prevent the halation in the dummy cell, thereby alleviating the wiring disconnection by the step difference at the boundary line.

In the semiconductor device to be explained in the following, the buried layer employed for reducing the resistance of the collector area of the bipolar transistor is modified from the conventional rectangular shape to a comb or grid shape, in order to form bipolar transistors with different collector-base junction capacitances per unit area, whereby two or more bipolar transistors of different yield voltages can be simultaneously formed without additional steps in the process.

(Embodiment 10)

Figure 16:
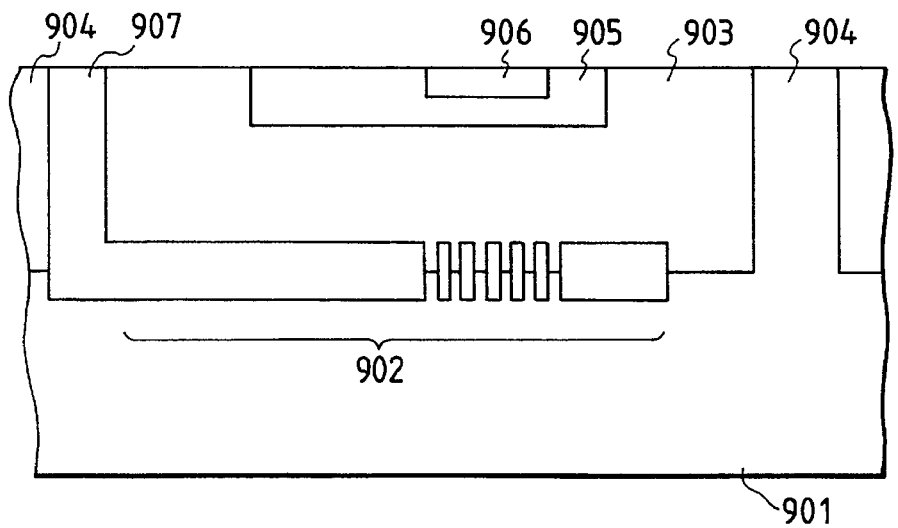
FIG. 16 is a cross-sectional view of a bipolar transistor constituting an embodiment of the present invention.

FIG. 16 illustrates an embodiment of the semiconductor device of the present invention, wherein shown are a p-silicon substrate 901; a buried n-collector layer 902 formed in a grid shape; an n-epitaxial area 903; a p-isolation area 904 for element isolation; a p-base area 905 constituting the device; a high impurity concentration emitter area 906 constituting the device; and a high impurity concentration n-collector area 907 constituting the device.

Figure 17:
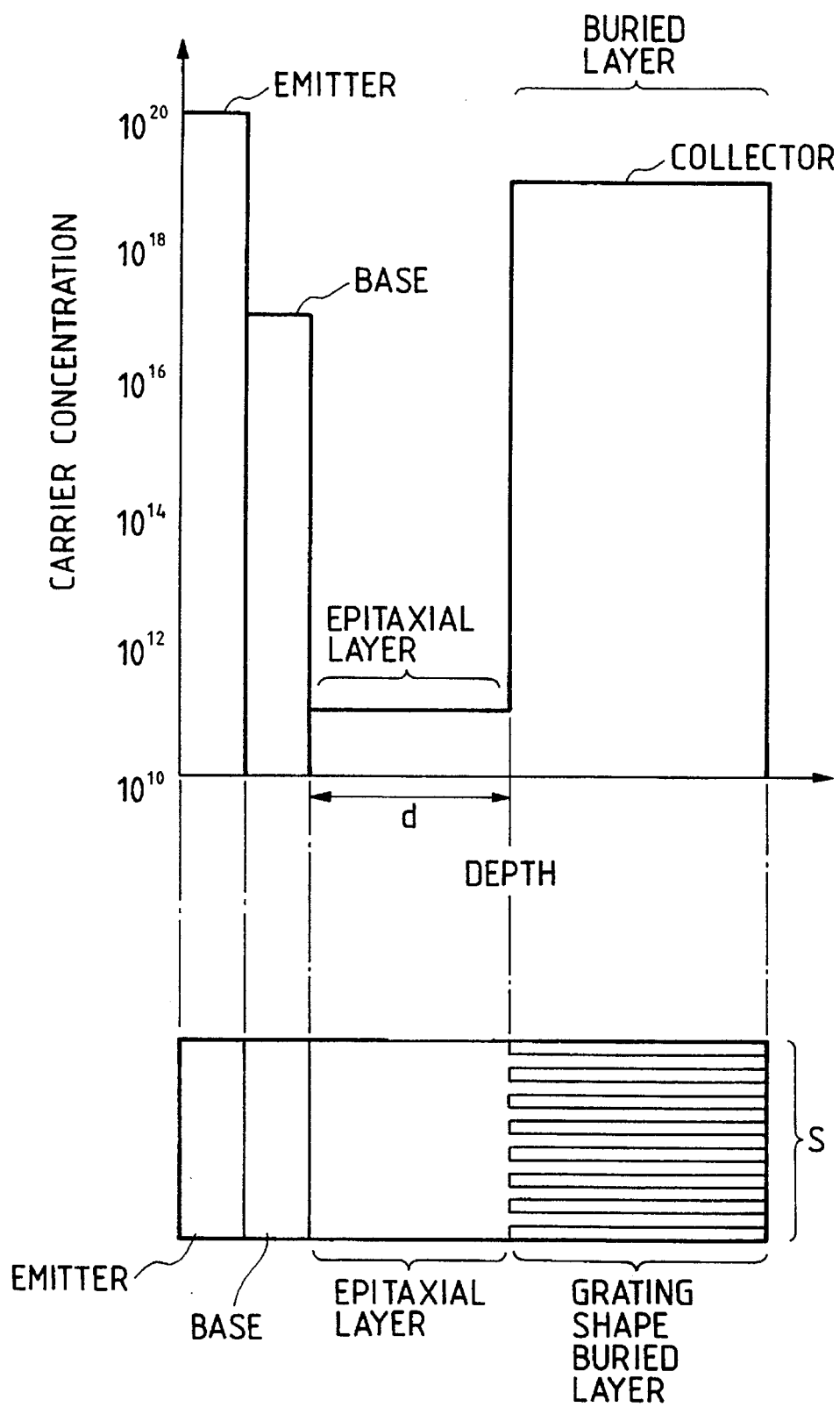
FIG. 17 is a view showing the principle of the present invention.

Now reference is made to FIG. 17 for explaining why the breakdown voltage $BV_{CEO}$ can be made higher by grid-shaped formation of the buried collector layer in the bipolar transistor.

The breakdown voltage $BV_{CEO}$ is the emitter-collector voltage in a state of punch-through, where the entire impurity $N_B$ in the active neutral base area is completely ionized and the base is completely depleted. In this state $BV_{CEO} \equiv V_{NB=0}$.

In a state where the emitter-collector voltage is zero ($V_{CEO}=0$), if the epitaxial layer is completely depleted by the internal potential between the base and the collector, the base-collector capacitance $C_{CB}$ is substantially constant at the voltage not exceeding $BV_{CEO}$ and is represented by:

$$C_{CB} \simeq K\epsilon_0 \frac{S}{d}$$

wherein K is relative dielectric constant, $\epsilon_0$ is dielectric constant in vacuum, S is the area of the buried layer, and d is the width of the epitaxial layer.

Consequently the charge amount $Q_B$ in the base, generated when the emitter is grounded and a voltage $V_{CEO}$ is applied between the emitter and the collector is represented by:

$$Q_B = C_{CB} V_{CEO}.$$

Therefore the voltage $BV_{CEO}$, corresponding to a state of $Q_B = N_B$ by ionization of the entire impurity in the active base area, is represented by:

$$BV_{CEO} = \frac{N_B}{C_{CB}} \simeq \frac{N_B}{K\epsilon_0} \cdot \frac{d}{S}$$

This relation indicates that, for increasing the breakdown voltage $BV_{CEO}$, the epitaxial layer has to be enlarged in the width d, or has to be deposited thicker. On the other hand, a smaller width d of the epitaxial layer is effective for increasing the cut-off frequency $f_T$ of the bipolar transistor, said width d is preferably made smallest, within the extent permitted by the breakdown voltage.

However, in an LSI containing bipolar transistors with two or more power source systems, the above-mentioned width d is determined by the breakdown voltage of the bipolar transistor driven by the highest power source voltage, so that the bipolar transistor having the same structure but driven with a lower power source voltage is inevitably associated with a lower cut-off frequency. According to the present invention, however, $BV_{CEO}$ can be elevated by the grid-shaped formation of the buried layer for reducing the area S in effective manner. It is therefore rendered possible to form bipolar transistors of two or more breakdown voltages $BV_{CEO}$ within a same wafer, without any additional steps in the process.

Also the cut-off frequency of the bipolar transistors can naturally be increased, because the base-collector capacitance $C_{CB}$ can be made smaller.

Figure 18A:
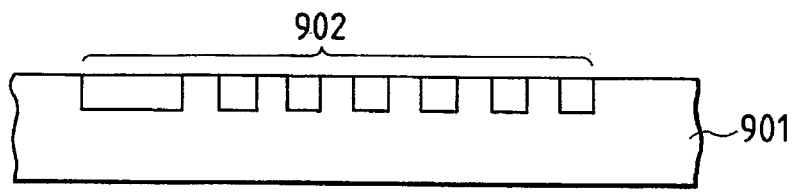
FIGS. 18A to 18D are cross-sectional views showing the producing method for the semiconductor device constituting an embodiment of the present invention.

FIGS. 18A to 18D illustrate the process for producing the above-explained device. In the following there will be explained, as an example, a case of employing a p-silicon substrate. At first, as shown in FIG. 18A, an insulation film, for example a thermal oxide film, for the diffusion mask is formed on a p-silicon substrate 901 with an impurity concentration of $10^{14}$–$10^{17}$ cm$^{-3}$ and is patterned in necessary positions, and an n$^+$ diffusion layer 902 is formed with Sb or As with a high concentration of $10^{18}$–$10^{20}$ cm$^{-3}$.

Figure 18B:
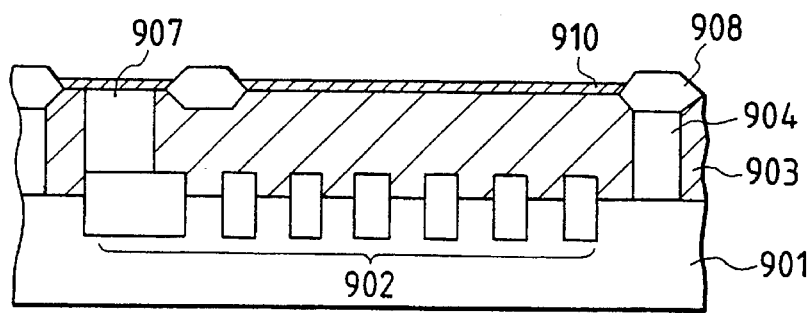

Then the above-mentioned insulation film is totally removed, and an n-epitaxial layer 903 is deposited on the entire surface of the wafer as shown in FIG. 18B. Said epitaxial layer has a thickness of 0.5 to 10 µm and specific resistivity of 0.1–30 Ω·cm. Then a thermal oxide film is formed for example with a thickness of 200 Å on the epitaxial film, and a p-impurity such as boron is introduced by ion implantation for example with a doze of $1\times10^{13}$ cm$^{-2}$ and an acceleration voltage of 70 KeV, employing a resist mask, followed by heat treatment, to form a diffused isolation layer 904. Then formed is an n$^+$ area 907 with a high impurity concentration and a large diffusion depth. In this formation, the heat treatment and the concentration have to be so selected that said n$^+$ area 907 sufficiently reaches the n$^+$ buried layer 902.

Then a thermal oxide film 910 is formed with a thickness for example of 500 Å on the entire wafer surface, then an antioxidative insulation film, for example of silicon nitride, is deposited with a thickness of ca. 2000 Å and is patterned in the field area. Subsequently selective oxidation is conducted for example for 7000 Å to form a field oxide film 908, and the nitride film is removed.

Figure 18C:
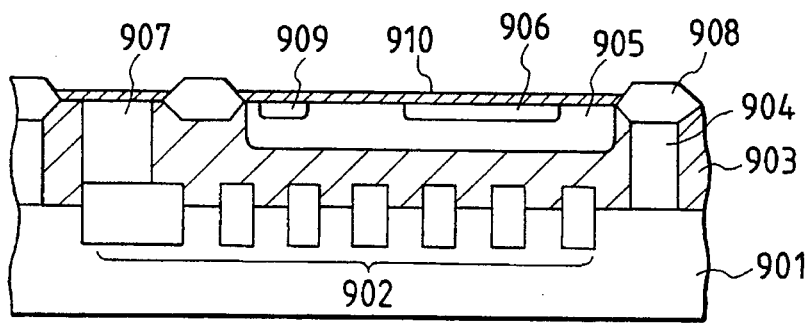

Then, as shown in FIG. 18C, boron ions are implanted, utilizing the filed oxide film 908 and a resist as the mask, and heat treatment is conducted at ca. 1000° C. to form an active base area 905. Subsequently arsine ion implantation is conducted at 100 KeV with a doze of $5\times10^{15}$ cm$^{-2}$ with a resist mask to form an n-emitter area 906 of a high impurity concentration, and boron ion implantation is conducted at 50 KeV with a doze for example of $5\times10^{15}$ cm$^{-2}$, followed by thermal diffusion, to form a p-area 909 of a high impurity concentration.

Figure 18D:
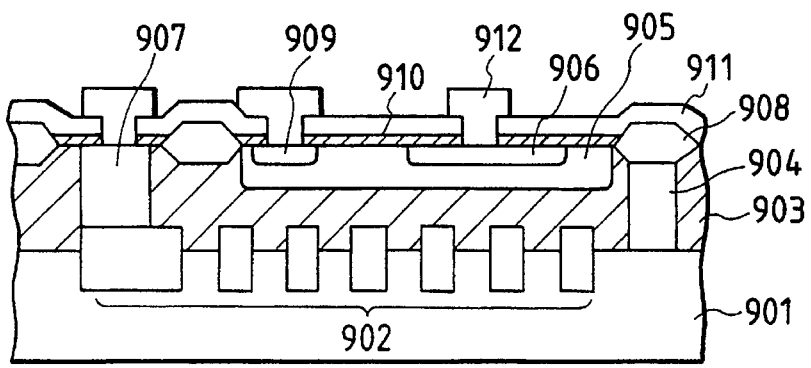

Then, as shown in FIG. 18D, a SiO$_2$ film 911 is deposited by CVD with a thickness for example of 5000 Å, and is patterned to open contact holes. Subsequently aluminum, for example, is deposited on the surface and is patterned.

In this manner for process does not require any additional steps, and, even in case two or more power source systems are employed, a high cut-off frequency can be attained even in the bipolar transistor driven with a lower power source voltage.

The semiconductor device to be explained in the following is provided with an electrode serving to control the surface state of the control electrode area and positioned, across an insulation film, on the surface of the control electrode area, including the vicinity of the junction of said control electrode area and a first main electrode area, and applies a predetermined voltage to the first-mentioned controlling electrode, thereby suppressing the recombination current in the surficial depletion area.

Also the method for producing the above-mentioned semiconductor device, to be explained in the following, is featured by using the above-mentioned electrode for controlling the surface state of the control electrode area as the mask in the formation of the first main electrode area, whereby said controlling electrode can be positioned, in self alignment, across the insulation film, on the surface of the control electrode area including the vicinity of the junction between said control electrode area and the first main electrode area.

At first, there will be explained the conditions for forming the electrode for controlling the surface state of the control electrode area.

In case the base area constituting the control electrode area is composed of a p-type semiconductor and an electrode is provided thereon across an insulation film, the flat band voltage $V_{FB}$ of said semiconductor can be represented by:

$$V_{FB} = \phi_{MS} - \frac{Q_{SS}}{C_0} - \frac{1}{C_0} \cdot \int_0^{x_0} \frac{x}{x_0} \rho(X) dx$$

wherein:

$\phi_{MS}$: difference in work function between the electrode and the base;

$Q_{SS}$: interfacial charge per unit area;

$C_0$: capacitance of the insulation film;

$x_0$: thickness of the insulation film; and $\rho$: charge in the insulation film.

Thus, in order not to deplete the surface of the p-type semiconductor, a voltage more negative than the flat band voltage $V_{FB}$ should be applied to the electrode.

In the foregoing equation, the term:

$$\frac{1}{C_0} \int_0^x \frac{x}{x_0} \rho(x)dx$$

becomes very large in a film formed for example by CVD, but is negligibly small for example in a thermal oxide film prepared under satisfactory conditions. Also $Q_{SS}$ is $10^{11}$ cm$^{-3}$ at largest in a thermal oxide film prepared under satisfactory conditions, so that the term $Q_{SS}/C_0 = 0.093$ V for a thickness of the oxide film of 200 Å.

If the electrode is formed with p-polysilicon with an impurity concentration of $1 \times 10^{20}$ cm$^{-3}$, $\phi_{MS}$ becomes 0.12–0.18 V within an impurity concentration range of $1 \times 10^{17}$–$1 \times 10^{18}$ cm$^{-3}$ generally employed for the base.

Consequently, $V_{FB}$ becomes 0.03–0.09 V. Since there should be applied a voltage more negative than the flat band voltage $V_{FB}$ in order not to deplete the surface of the base, the base area in such case should be given a potential same as that of the p-polysilicon or a positive potential. (Embodiment 11)

Figure 19A:
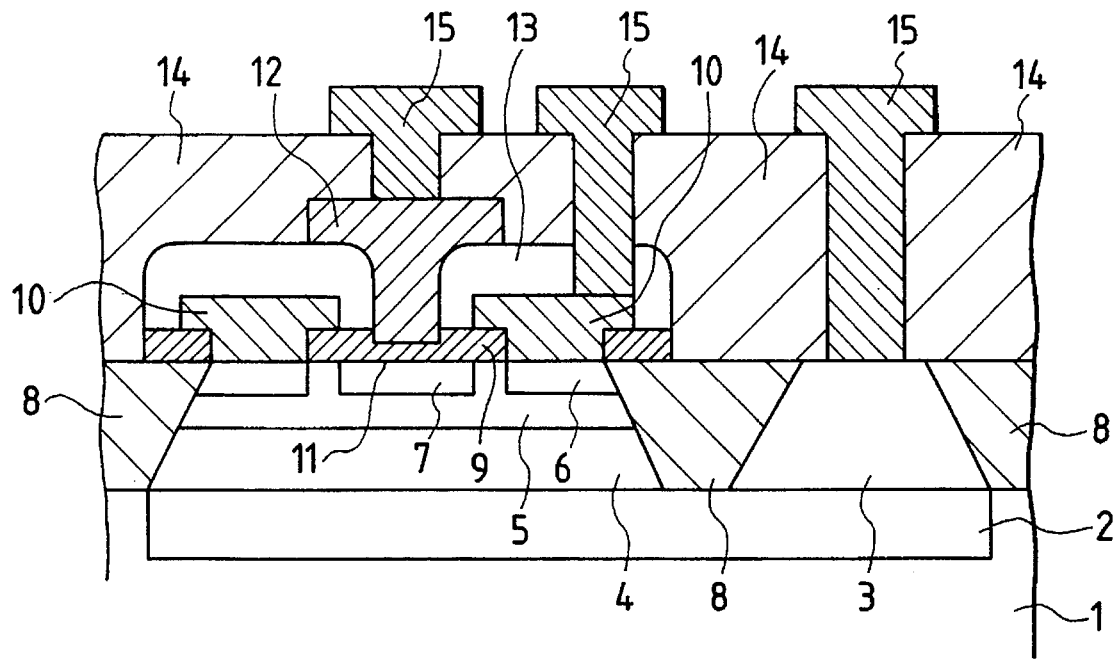
FIGS. 19A and 19B are respectively cross-sectional views of a preferred embodiment of the semiconductor device of the present invention, and a partial magnified view of an area A in FIG. 19A.
Figure 19B:
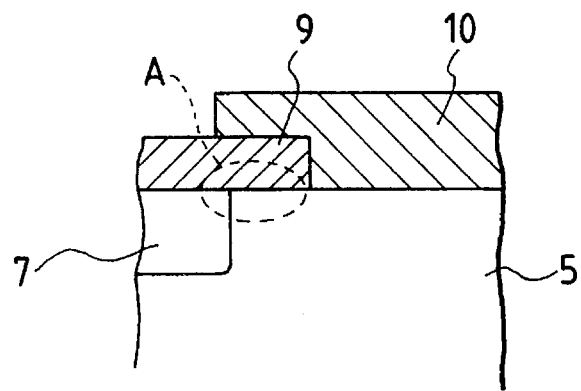

FIG. 19A is a schematic cross-sectional view of a preferred embodiment of the semiconductor device of the present invention showing little variation in $H_{FE}$, and FIG. 19B is a partial magnified view of FIG. 19A.

Although the present invention is applicable to any bipolar transistor (including photosensor or the like with bipolar configuration), but is particularly effective, as explained before, in a bipolar transistor in which the injection of the minority carriers from the base area constituting the control electrode area into the emitter area constituting the first main electrode area for the purposes of attaining a higher speed in the transistor function, a higher current amplification gain, and a higher limit of use in the high frequency range. For this reason, there will be explained, in the following, an embodiment applied to an NPN transistor designed for a high current amplification gain.

In FIGS. 19A and 19B, there are shown a p-semiconductor substrate 1; an n-buried area 2 formed for reducing the collector resistance; an n-area 3 formed for reducing the collector resistance; an n$^-$ area 4 constituting the collector (2nd main electrode area); a p-base area (constituting control electrode area) 5; a p$^+$ area 6 for reducing the base resistance; an n$^+$ emitter area (constituting 1st main electrode area) 7; an element isolation area 8 composed of an oxide film; an insulation film 9 such as a thermal oxide film; a p-polysilicon area 10; a thin SiO$_2$ film 11 capable of passing the tunneling current; an n-polysilicon area 12; insulation films 13, 14; and metal electrodes 15 composed for example of Al. In this embodiment, on the surface of the p-area 5, including the junction area between said p-base area 5 and the n$^+$ emitter area 7 (area A in FIG. 19B), a part of the p-polysilicon electrode 10 is extended across the insulation film 9, thereby controlling the surface state of the p-base area.

FIGS. 20A to 20E are cross-sectional views showing the process flow for obtaining the semiconductor device shown in FIGS. 19A and 19B.

Figure 20A:
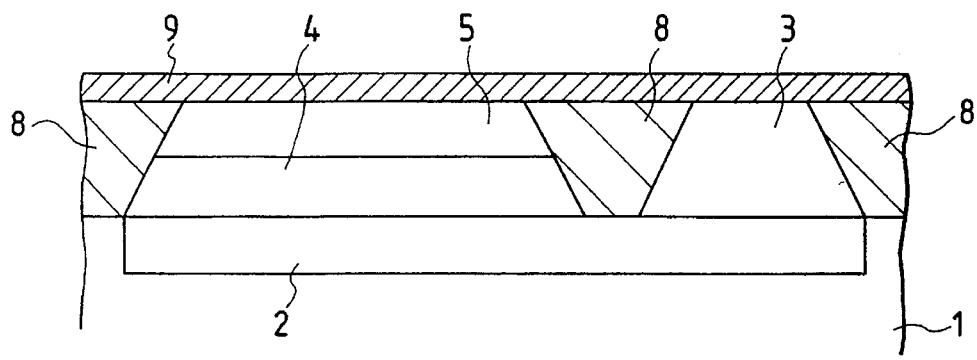
FIGS. 20A to 20E are cross-sectional views showing process flow for producing the semiconductor device shown in FIGS. 19A and 19B.

At first, the n-buried area 2 is formed in a desired position on the p-type semiconductor substrate 1, and then the n-epitaxial area 4 is formed, as shown in FIG. 20A. Subsequently silicon is etched in a desired position, and said position alone is selectively oxidized to form the element isolation area 8. Then the n-impurity is introduced in a desired position to form the n-area 3. Subsequently the n-impurity is introduced into a desired position, and the insulation film 9 is formed for example by thermal oxidation.

Figure 20B:
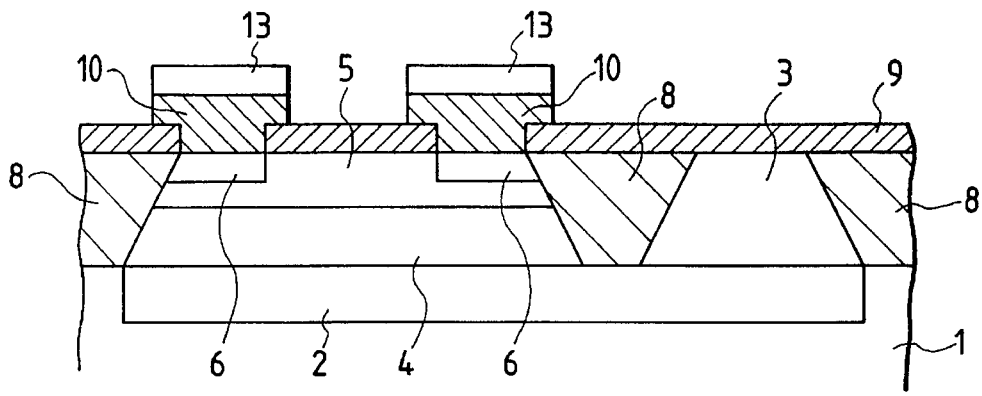

Then, as shown in FIG. 20B, the insulation film 9 is etched in a desired position, and polysilicon 10 is deposited by reduced pressure CVD at 550°–650° C. Then p-impurity, such as boron, is introduced by ion implantation into the polysilicon 10, and heat treatment is effected to form the p$^+$ area 6 in the substrate. Then, on the polysilicon 10, there is formed the insulation film 13 by oxidation of the polysilicon 10, or by CVD deposition of SiO$_2$ or Si$_3$N$_4$. Subsequently resist patterning is conducted, and the polysilicon layer 10 and the insulation film 13 are etched off except for the desired positions.

Figure 20C:
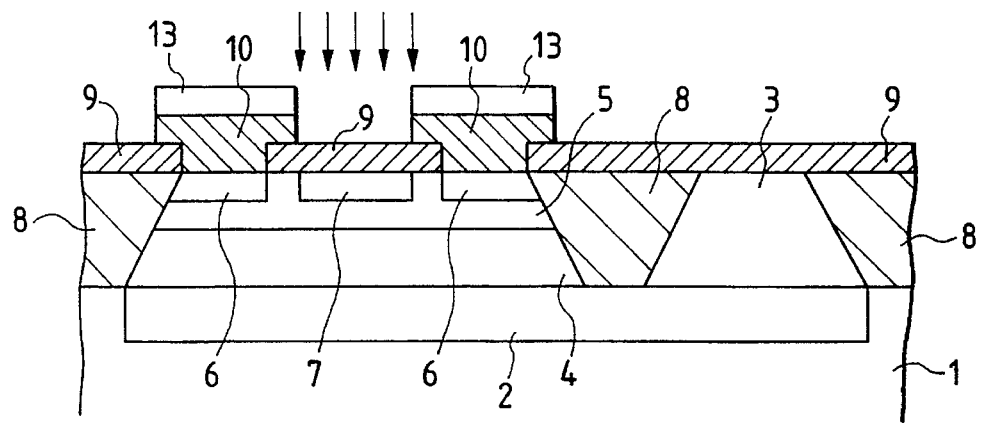

Then, as shown in FIG. 20C, the n-impurity ions such as As$^+$ or p$^+$ are introduced by ion implantation, in self aligned manner utilizing the polysilicon layer 10 and the insulation film 13 as a mask, followed by heat treatment, to form the n+ area 7. Since said n+ area is formed in self aligned manner, utilizing the polysilicon layer 10 and the insulation film 13 as the mask, there can be obtained a structure including the p-polysilicon electrode 10 which is positioned, across the insulation film 9, on the surface of the p-area 5 including the junction between said p-area 5 and the n$^+$ area 7. Since the p-area 5 and the p-polysilicon electrode 10 are of a same potential, the formation of the depletion layer on the surface of the p-area 5 can be prevented if the insulation film 9 is so constructed as to contain little fixed charge. The depth of the junction of the n$^+$ area 7 is selected smaller than the diffusion length of the positive holes in said area.

Figure 20D:
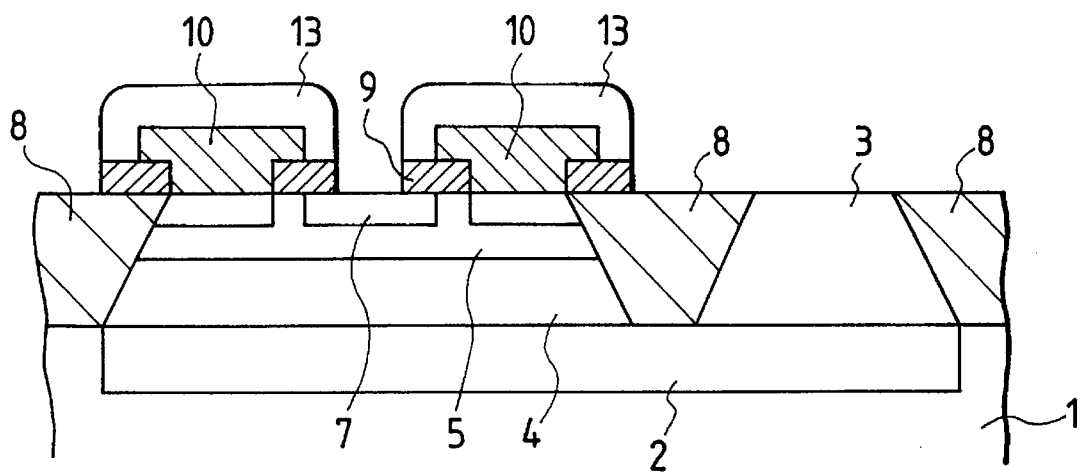

Subsequently, as shown in FIG. 20D, an insulation film such as of SiO$_2$ or Si$_3$N$_4$ is deposited by CVD and is anisotropically etched with an etching apparatus of parallel flat plate type, thereby exposing the surface of the n$^+$ area 7, with side walls remaining at the edges of the p-polysilicon electrodes 10.

Figure 20E:
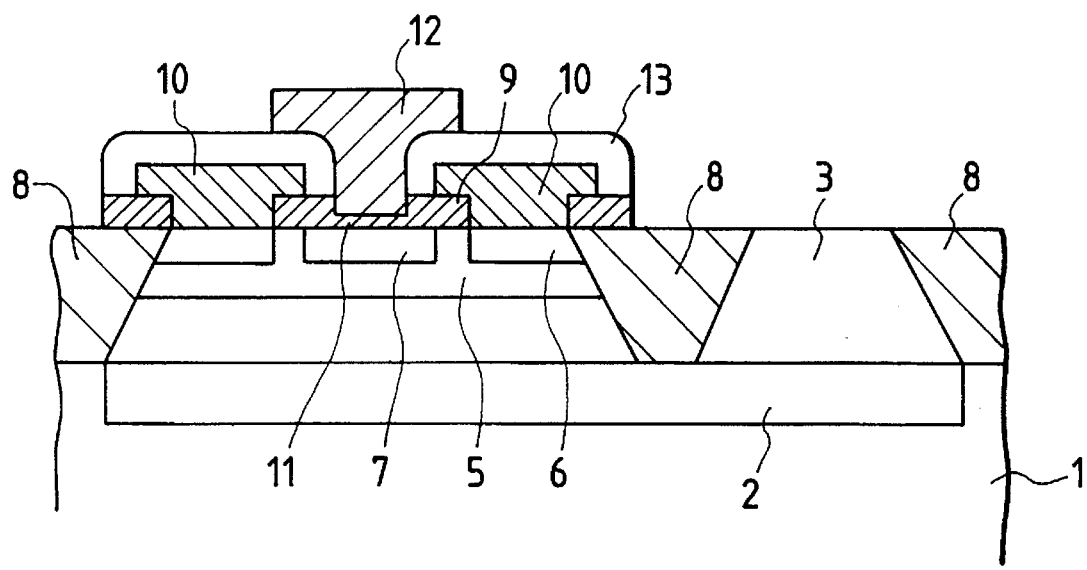

Then, as shown in FIG. 20E, a thin film 11 is formed by low-temperature oxidation at 500° C.–650° C. (with a thickness of 7–15 Å), and polysilicon 12 is deposited by low pressure CVD. Subsequently n-impurity such as As$^+$ or p$^+$ is introduced by ion implantation, and heat treatment is effected.

The above-mentioned ion implantation was conducted with a doze of $5 \times 10^{15}$–$1 \times 10^{16}$ ion/cm$^2$ and at an annealing temperature not exceeding 900° C.

The above-explained structure containing the thin film 11 capable of passing the tunneling current and positioned on the emitter area 7 and the n-polycrystalline silicon 12 formed on said thin film under the above-explained conditions provides an energy gap capable of suppressing or inhibiting the injection of the minority carriers, and there can be obtained a bipolar transistor with suppressed base current if the diffusion depth of the emitter area 7 is selected smaller than the diffusion length of the minority carriers in said emitter area 7.

Then the insulation film 14, consisting of SiO$_2$ or SiO$_2$ containing P or B, is formed by CVD and heat treated.

Subsequently contact holes are formed in the positions of the lead electrodes, and a metal such as Al is deposited by sputtering or CVD and etched to form the electrodes 15, whereby the semiconductor device (bipolar transistor) of the structure shown in FIG. 19A is finally obtained.

Figure 21:
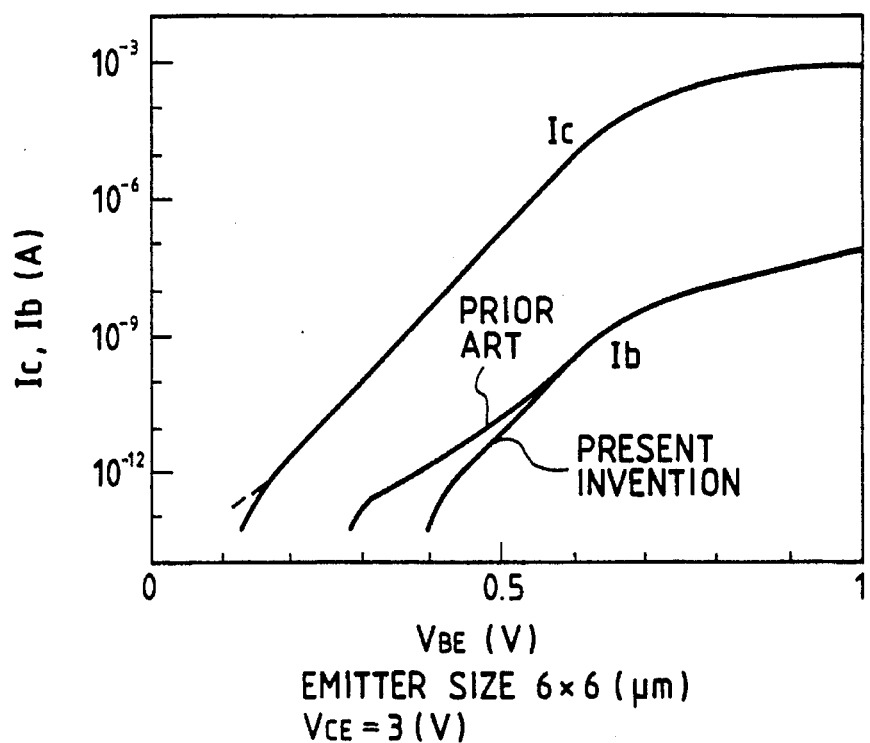
FIG. 21 is a chart showing the collector current $I_C$ and the base current $I_B$ as a function of the emitter-base voltage $V_{BE}$ in the bipolar transistor of the present invention and in the conventional bipolar transistor.

FIG. 21 shows the collector current $I_C$ and the base current $I_B$ as a function of the emitter-base voltage $V_{BE}$, in the bipolar transistor of the present invention and in the conventional bipolar transistor.

The conventional bipolar transistor shown an increase in the base current in the low current region, due to the influence of the recombination current in the depletion area, while, in the bipolar transistor of the present invention, the base current is substantially parallel to the collector current.

Figure 22:
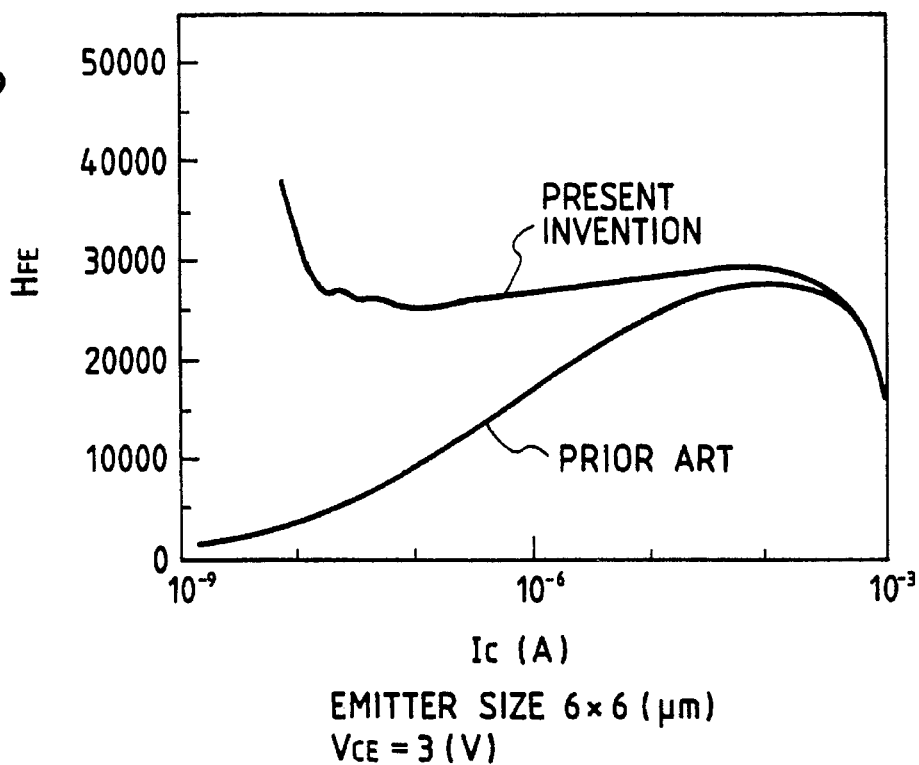
FIG. 22 is a chart showing the dependence of the current amplification gain $H_{FE}$ on the collector current $I_C$.

FIG. 22 shows the dependence of the current amplification gain $H_{FE}$ on the collector current $I_C$. In the conventional bipolar transistor, the current amplification gain decreases in the low current region, because of the increase of the base current in said region as explained above. On the other hand, in the bipolar transistor of the present invention, the current amplification gain is substantially constant at a high level of 25000–30000, over a wide collector current range.

As explained in the foregoing, the dependence of the current amplification gain on the collector current can be reduced by preventing formation of the depletion area on the surface of the base area, by means of an electrode positioned, across the insulation film, on the surface of the base area including the vicinity of the emitter-base junction.

In the foregoing there has been explained a case in which the emitter electrode is composed of a thin film capable of passing the tunneling current and a polycrystalline layer laminated on said thin film and capable of forming such an energy gap, with respect to said emitter area, as to suppress or inhibit the injection of the minority carriers, but a similar effect can be attained by an electrode controlling the surface state of the base area also in a transistor in which the thin film 11 is absent and the electrodes are formed with a metal such as Al or polysilicon.
(Embodiment 12)

Figure 23:
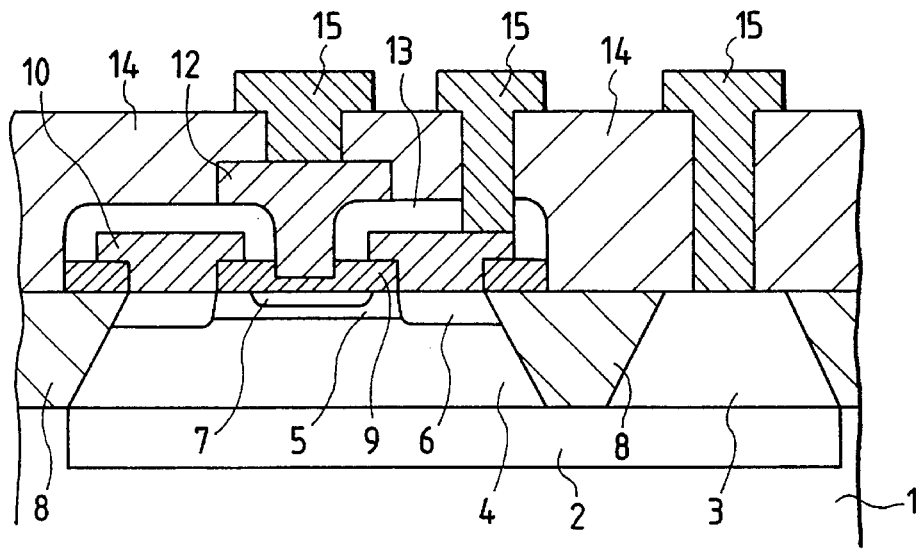
FIG. 23 is a schematic cross-sectional view of another embodiment of the semiconductor device of the present invention.

FIG. 23 is a schematic cross-sectional view of another embodiment of the semiconductor device of the present invention showing little change in $H_{FE}$, wherein components equivalent to those in FIGS. 19A and 19B are represented by same numbers.

In the embodiment 11, the electrode 10 for controlling the surface state of the base area 5 is formed after the formation of said base area 5, but, in the present embodiment, the base area 5 is formed by ion implantation after the formation of the electrode 10, utilizing said electrode 10 as a mask. Thus, there is obtained an advantage that the mask defining the base area can be dispensed with.

Figure 24A:
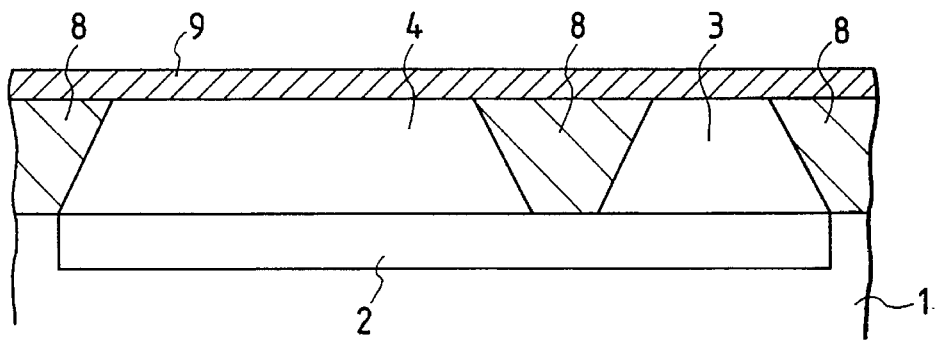
FIGS. 24A and 24B are cross-sectional views showing parts of the process flow for producing the semiconductor device shown in FIG. 23.
Figure 24B:
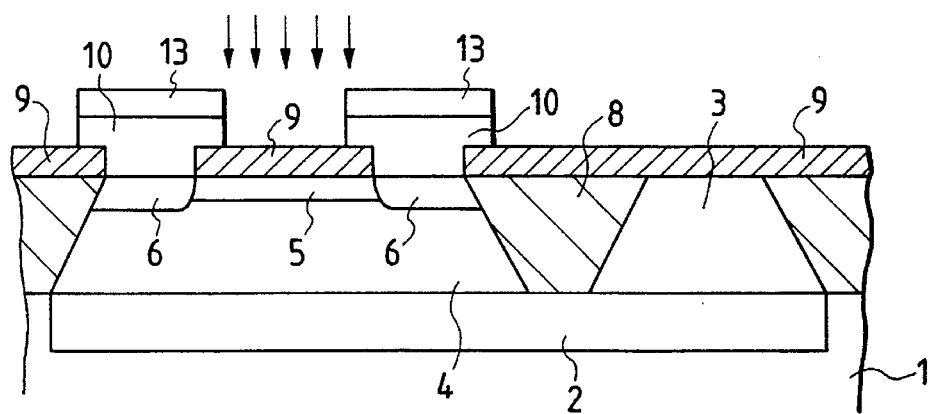

FIGS. 24A and 24B are schematic cross-sectional views showing a part of the process flow for producing the semiconductor device shown in FIG. 23.

At first, as shown in FIG. 24A, the n-buried area 2 is formed in a desired position on a p-type semiconductor substrate 1, and the n-epitaxial area 4 is formed. Subsequently silicon is etched in a desired position and said position is selectively oxidized to form the isolation area 8. Then n-impurity is introduced in a desired position to form the n-area 3.

Then, as shown in FIG. 24B, the insulation film is etched in a desired position, and polysilicon 10 is deposited by low pressure CVD. Subsequently p-impurity is introduced into said polysilicon 10 and heated treated, thereby forming the $p^+$ area 6 for reducing the base resistance, in the substrate. Then the insulation film 13 is formed on the polysilicon 10, by oxidation thereof or deposition of $SiO_2$ or $Si_3N_4$ by CVD.

Subsequently resist patterning is conducted, and the polysilicon layer 10 and the insulation film 13 are etched off except for the desired positions. Then n-impurity such as $b^+$ is introduced by ion implantation by means of self alignment utilizing the polycrystalline silicon layer 10 and the insulation film 13 as the mask, and is heat treated until the implanted p-impurity reaches the previously formed $p^+$ area 6 by diffusion, whereby the base area 5 is thus formed.

Thereafter the emitter area is formed, as in the embodiment 11, by self alignment employing the polycrystalline silicon layer 10 and the insulation film 13 as the mask.
(Embodiment 13)

Figure 25:
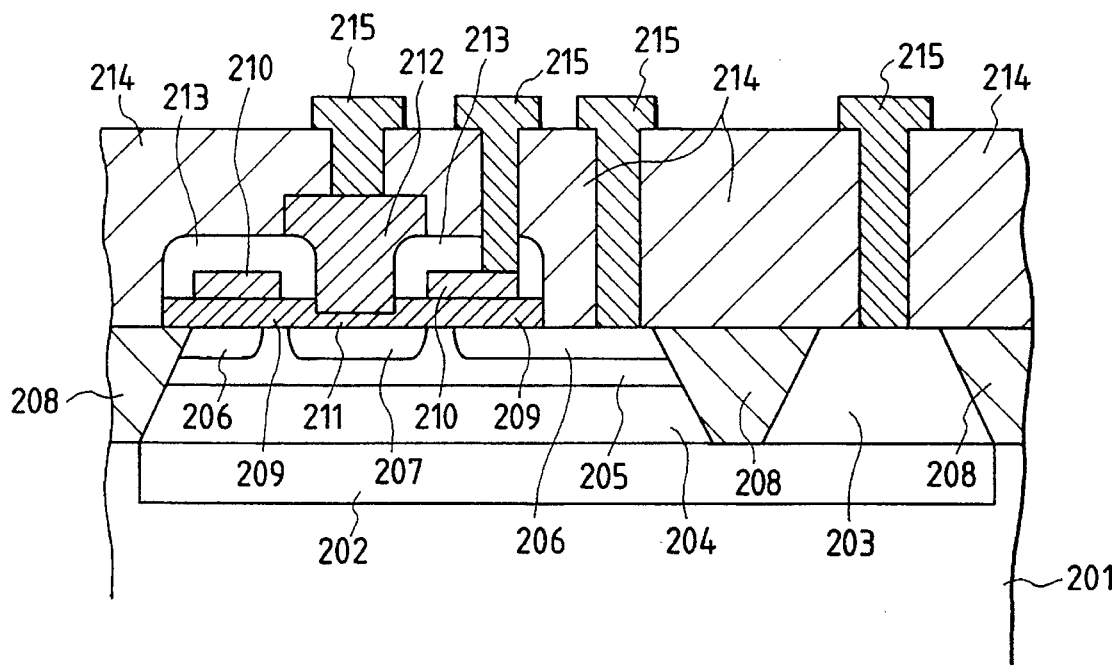
FIGS. 25 to 27 are schematic cross-sectional views showing still other embodiments of the semiconductor device of the present invention.

FIG. 25 is a schematic cross-sectional view of another embodiment of the semiconductor device of the present invention showing little variation in $H_{FE}$.

In the embodiments 11 and 12, the electrode for controlling the surface state of the base area also serves as the lead electrode therefor, but, in the present embodiment, a lead electrode for the base area is separately formed from the electrode for controlling the surface state of the base area.

In this structure, since said electrodes can assume different potentials, the electrode for controlling the surface state of the base area need not necessarily be composed of p-polysilicon but can be composed, for example, of n-polysilicon. In this case, said electrode is given such a voltage as not to deplete the surface of the base area.

In FIG. 25, there are shown a p-type semiconductor substrate 201; an n-buried area 202 formed for reducing the collector resistance; an n-area 203 formed for reducing the collector resistance; an $n^-$ area 204 constituting the collector; a p-base area 205; a $p^+$ area 206 for reducing the base resistance; an $n^+$ emitter area 207; an element isolation area 208 composed of an oxide film; an insulation film 209; an electrode 210 for controlling the surface state of the base area; a thin $SiO_2$ film 211 capable of passing the tunneling current; an n-polysilicon area 212; insulation films 213, 214; and metal electrodes 215 composed for example of Al.
(Embodiment 14)

Figure 26:
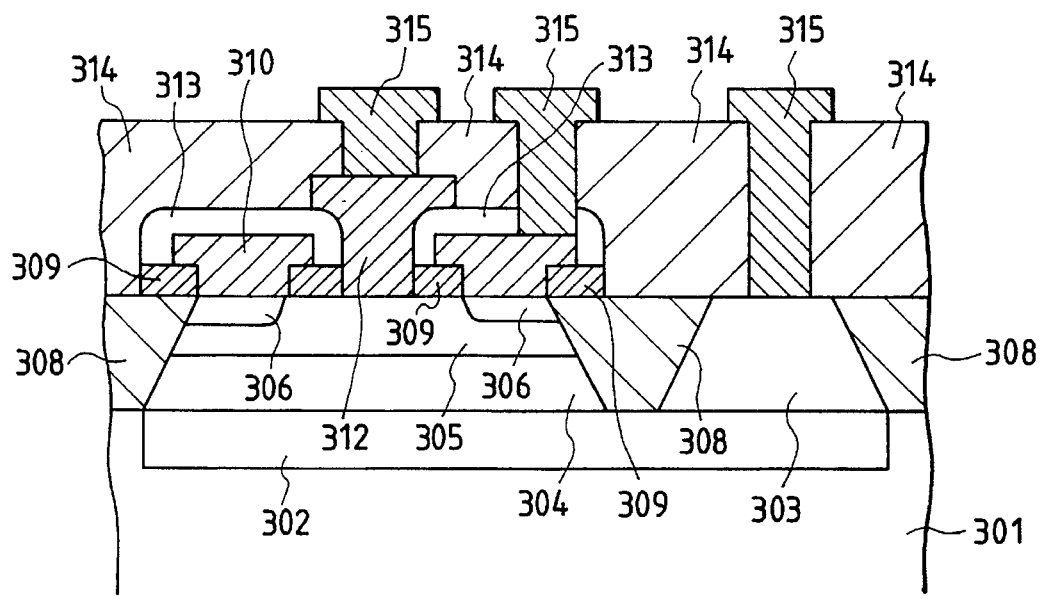

FIG. 26 is a schematic cross-sectional view of still another embodiment of the semiconductor device of the present invention, showing little variation in $H_{FE}$.

In the present embodiment, the emitter area is composed of a material having an energy band gap wider than that of the base area, such as microcrystals or amorphous semiconductor. Except for said emitter area, this embodiment is constructed same as in the embodiment 11.

In FIG. 26, there are shown a p-type semiconductor substrate 301, an n-buried area 302 formed for reducing the collector resistance; an n-area 303 formed for reducing the collector resistance; an $n^-$ area 304 constituting the collector; a P-base area 305; a $p^+$ area 306 for reducing the base resistance; an element isolation area 308 composed of an oxide film; an insulation film 309; an electrode 310 for controlling the surface state of the base area; an emitter area 312 composed of a substance having a band gap wider than that of the base area; insulation films 313, 314; and metal electrodes 315 composed for example of Al.
(Embodiment 15)

Figure 27:
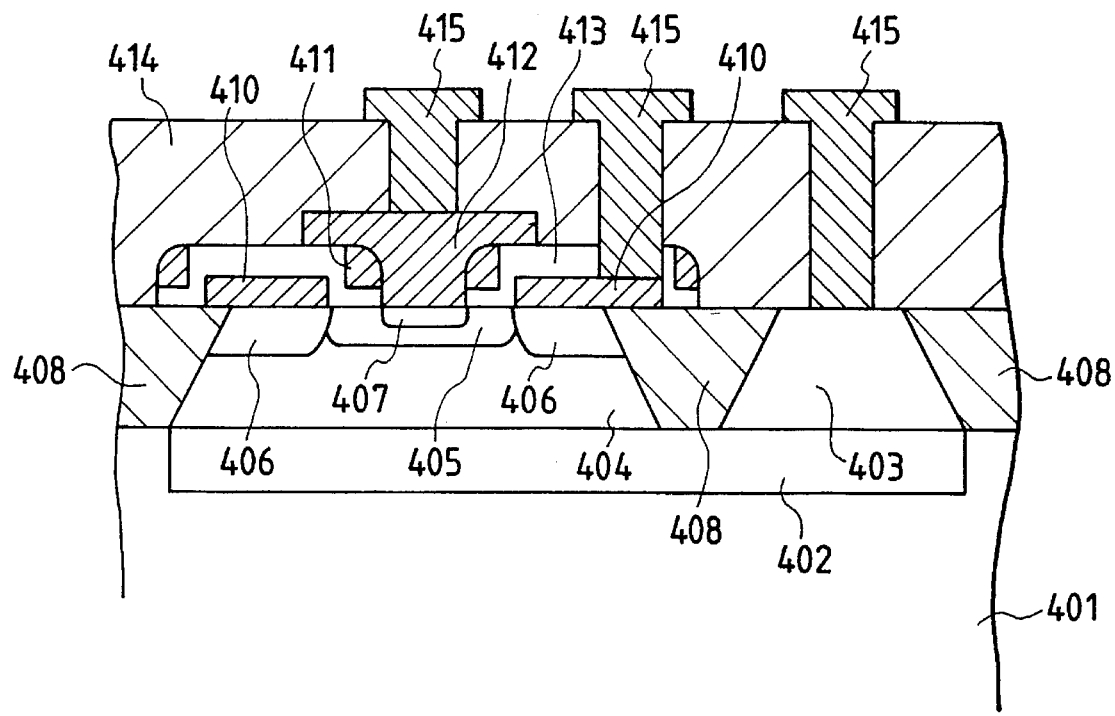

FIG. 27 is a schematic cross-sectional view of still another embodiment of the semiconductor device of the present invention, showing little variation in $H_{FE}$.

The present embodiment is featured by a fact that the electrode for controlling the surface state of the base area is of a same potential as that of the emitter area. The present embodiment is also adapted for size reduction, since the base and emitter areas are formed by self alignment after the formation of the base lead electrode.

In FIG. 27 there are shown a p-type semiconductor substrate 401; an n-buried area 402 formed for reducing the collector resistance; an n-area 403 formed for reducing the collector resistance; an $n^-$ area 404 constituting the collector; a p-base area 405; a $p^+$ area 406 for reducing the base resistance; an n-emitter area 407; an element isolation area 408 composed of an oxide film; a lead electrode 410 for the base area; an electrode 411 for controlling the surface state of the base area; n-polycrystalline silicon 412; insulation films 413, 414; and metal electrodes 415 composed for example of Al.

FIGS. 28A to 28E illustrate an example of the process flow for producing the semiconductor device shown in FIG. 27.

Figure 28A:
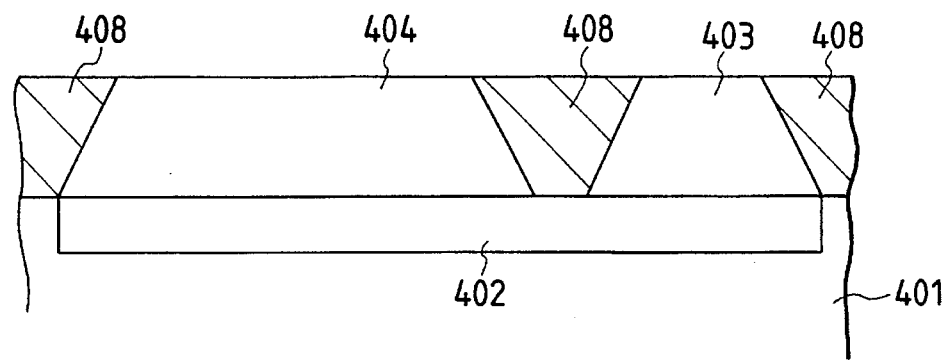
FIGS. 28A to 28E are cross-sectional views showing the process flow for producing the semiconductor device shown in FIG. 27.

At first, as shown in FIG. 28A, the n-buried area 402 is formed in a desired position of the p-semiconductor substrate 401, and the n-epitaxial area 404 is formed. Then silicon is etched at a desired position, and said position alone is selectively oxidized to form the element isolation area 408. Subsequently n-impurity is introduced in a desired position to form the n-area 403.

Figure 28B:
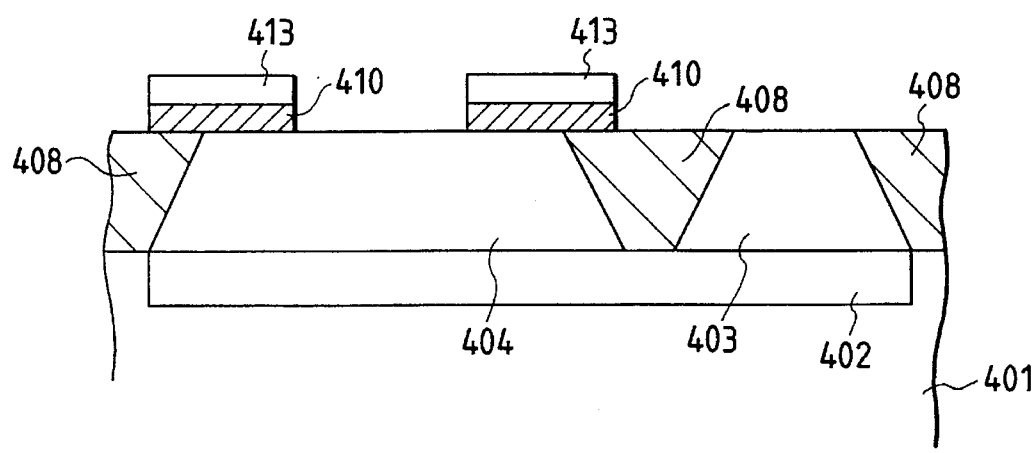

Then, as shown in FIG. 28B, polysilicon 410 is deposited by LP-CVD, followed by introduction of p-impurity, and thermal oxidation is conducted to form the oxide film 413 on the polysilicon 410. Subsequently etching of the polysilicon 410 and the oxide film 413 is executed, utilizing a photolithographically formed resist mask.

Figure 28C:
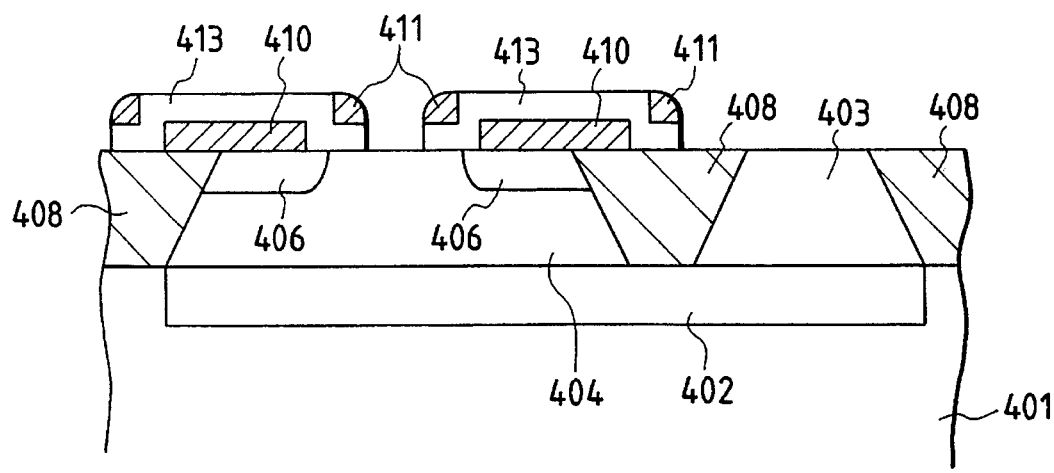

Then, as shown in FIG. 28C, the plysilicon 410 and the n-area 404 are thermally oxidized. In this step, the p-impurity diffuses from the polysilicon 410, thereby forming the external base area 406. Then polysilicon 411 is deposited and is subjected to anisotropic etching.

Figure 28D:
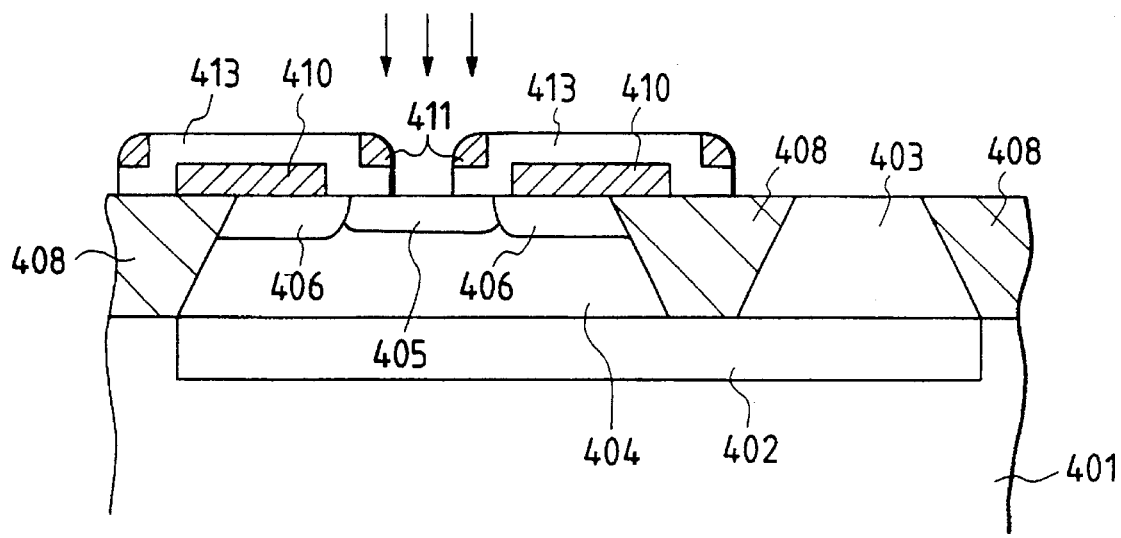

Then, as shown in FIG. 28D, p-impurity is introduced, in a position where the emitter is to be formed, by ion implantation, utilizing the polysilicon layers 410, 411 and the oxide film 413 as the mask, and heat treatment is conducted until the implanted impurity reaches the external base area 406 by diffusion. In this step the polysilicon 411 is doped into p-type.

Figure 28E:
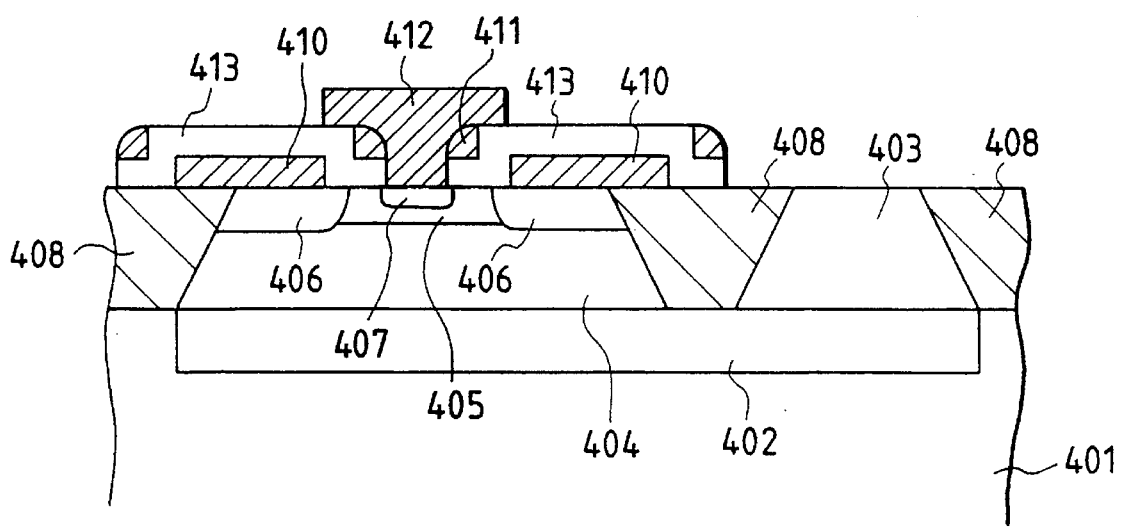

Then, as shown in FIG. 28E, polysilicon 412 is deposited, followed by introduction of n-impurity and heat treatment, and is etched off except for the desired part. The emitter area 407 is formed at said heat treatment.

Subsequently the insulation film 414 is formed, then contact holes for the lead electrodes are opened at desired positions, and the metal electrodes 415 are formed to complete the semiconductor device shown in FIG. 27.

In this manner there can be obtained the structure in which the electrode for suppressing the depletion of the surface of the base area is constituted by p-polysilicon 411 which is of a same potential as that of the n-polysilicon 412 constituting the lead electrode for the emitter area.

(Embodiment 16)

Figure 29:
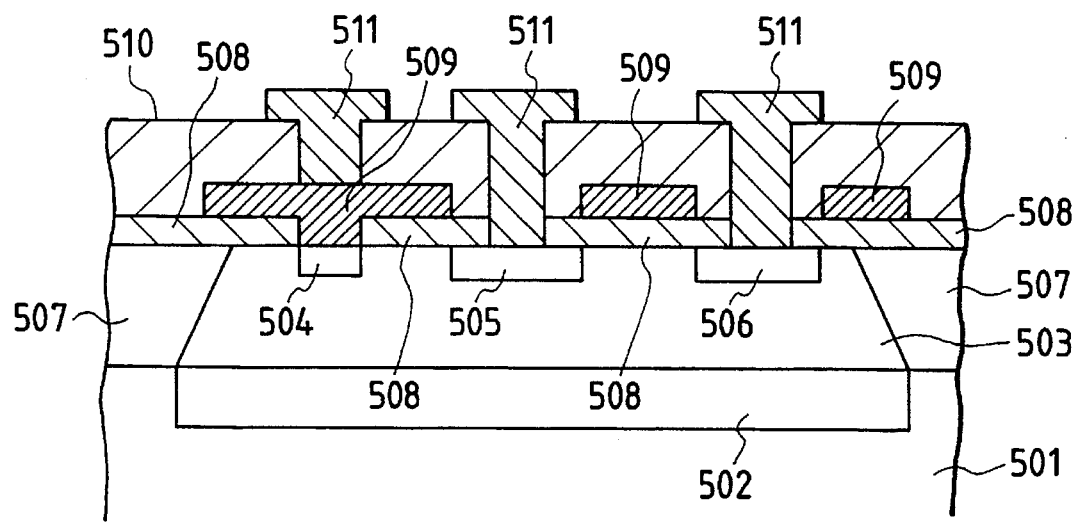
FIG. 29 is a schematic cross-sectional view showing another embodiment of the semiconductor device of the present invention.

FIG. 29 is a schematic cross-sectional view of another embodiment of the semiconductor device of the present invention, showing little variation in $H_{FE}$.

The present embodiment shows the application of the present invention to a lateral pnp bipolar transistor.

In FIG. 29, there are shown a p-type semiconductor substrate 501; an n-buried area 502; an $n^-$ epitaxial layer 503 constituting the base area; an $n^+$ area 504 constituting an electrode area of the base area; a, $p^+$ emitter area 505; a $p^+$ collector area 506; an element isolation area 507 composed of an oxide film; an insulation film 508; an $n^+$ polysilicon electrode 509 for controlling the surface state of the base area; an insulation film 510; and metal lead electrodes 511.

Also in this structure, the electrode for controlling the surface state of the base area serves also as the lead electrode of the base area and is maintained at a potential same as that of the base area, thereby preventing the depletion of the surface of the base area. The $n^+$ area 504 is formed by thermal diffusion of the n-impurity from the n-polysilicon. Also the $p^+$ emitter area 505 and the $p^+$ collector area 506 are formed by ion implantation employing the n-polysilicon 509 as the mask.

As detailedly explained in the foregoing, the semiconductor device of the present invention can prevent the depletion of the surface of the control electrode area, by providing an electrode for controlling the surface state of the control electrode area, positioned, across an insulation film, on the surface of said control electrode area including the vicinity of the junction between said control electrode area and the first main, electrode area. It is consequently rendered possible to suppress or annulate the current generated in the surfacial depletion area, thereby reducing the influence of such current generated in said depletion area on the control electrode current and thus enabling to produce a transistor showing little variation in the current amplification gain over a wide current range of the second main electrode.

Also the method of the present invention for producing the above-mentioned semiconductor device allows to form the first main electrode area in self alignment with respect to said electrode for controlling the surface state of the control electrode area, so that said electrode can cover the junction area between the control electrode area and the first main electrode area. Consequently, as the surface of the control electrode area that may detrimentally affect the characteristics of the transistor is securely covered by the aforementioned electrode for controlling the surface state of the control electrode area, the formation of the surfacial depletion area can almost completely prevented.

Also the semiconductor device of the present invention can control the electrical and physical properties of the metal-semiconductor contact to the optimum states for the function and the producing process of the semiconductor device.

Also the apparatus and the method of the present invention for producing the semiconductor device allows to form the oxide film without formation of the spontaneous oxide film, avoiding the involvement of the external air, whereby the current induced when an electric field is applied to the oxide film can be reduced to less than $1/10$, in comparison with the conventional case. Consequently said apparatus and method are effective in the production of USLI.

The external air involvement is possible in a well-designed vertical oxidation oven, but the apparatus of the present invention for producing the semiconductor device enables complete prevention of the external air involvement even in a horizontal oxidation oven in which such complete prevention of the external air involvement is generally difficult. In such case the oxide film of high quality can be obtained without any increase in the production cost, as already existing oven body and scavenger can be utilized. Naturally the concept of the present invention is applicable also to the vertical oxidation oven.

Also the semiconductor device of the present invention can prevent the disconnection of the wirings on the boundary line of the cells, by means of modification in the designing, thereby, without major change in the process for producing the integrated circuit, relaying on the already existing process. Consequently the period and the cost required for the development of a new process can be totally dispensed with, and there is also attained an additional advantage that the running cost at the mass production is not elevated.

Also according to the present invention, it is rendered possible, in the bipolar transistor, to increase the yield voltage $BV_{CEO}$ in the emitter-grounded state, by shaping the buried layer thereof in a grid pattern or the like. Therefore, in an LSI containing bipolar transistors belonging to two or more power source systems, the thickness of the epitaxial film may be made smaller, matching the breakdown voltage of the bipolar transistor driven by a lower power source voltage, so that a high cut-off frequency may be realized even in a bipolar transistor driven by the lower power source voltage.

The present invention is not limited to the foregoing embodiments, but is subject to various modifications and combinations, within the scope and spirit of the appended claims.

What is claimed is:

1. A bipolar structure semiconductor device provided with a control electrode area composed of a semiconductor of a first conductive type and first and second main electrode areas positioned in contact with said control electrode area and composed of a semiconductor of a second conductive type different from said first conductive type, further comprising:

an insulating layer on said control electrode area at least between said control electrode area and said first main electrode area; and an electrode electrically connected to said control electrode area through said insulating layer to control a surface state of said control electrode area.

2. A bipolar structure semiconductor device provided with a control electrode area composed of a semiconductor of a first conductive type and first and second main electrode areas positioned in contact with said control electrode area and composed of a semiconductor of a second conductive type different from said first conductive type, further comprising:

an insulating layer on said control electrode area at least between said control electrode area and said first main electrode area; and an electrode electrically connected to said control electrode area through an insulating layer on said control electrode area at least between said control electrode area and said first main electrode area to control a surface state of said control electrode area; and a thin film on said first main electrode area for passing a tunneling current, and a polycrystalline layer laminated on said thin film for forming, with respect to said first main electrode area, an energy gap for suppressing or inhibiting injection of minority carriers.

3. A bipolar structure semiconductor device provided with a control electrode area composed of a semiconductor of a first conductive type and first and second main electrode areas positioned in contact with said control electrode area and composed of a semiconductor of a second conductive type different from said first conductive type, further comprising:

an insulating layer on said control electrode area at least between said control electrode area and said first main electrode area; and an electrode electrically connected to said control electrode area through an insulating layer on said control electrode area at least between said control electrode area and said first main electrode area to control a surface state of said control electrode area wherein an energy band gap of said first main electrode area is wider than an energy band gap of said control electrode area.

4. A bipolar structure semiconductor device provided with a control electrode area composed of a semiconductor of a first conductive type and first and second main electrode areas positioned in contact with said control electrode area and composed of a semiconductor of a second conductive type different from said first conductive type, further comprising:

an insulating layer on said control electrode area at least between said control electrode area and said first main electrode area; and an electrode electrically connected to said control electrode area through an insulating layer on said control electrode area at least between said control electrode area and said first main electrode area to control a surface state of said control electrode area wherein said electrode is composed of polysilicon.

5. A bipolar structure semiconductor device provided with a control electrode area composed of a semiconductor of a first conductive type and first and second main electrode areas positioned in contact with said control electrode area and composed of a semiconductor of a second conductive type different from said first conductive type, further comprising:

an insulating layer on said control electrode area at least between said control electrode area and said first main electrode area; and an electrode electrically connected to said control electrode area through an insulating layer on said control electrode area at least between said control electrode area and said first main electrode area to control a surface state of said control electrode area, wherein said electrode extends from an extracting electrode connected electrically to said control electrode area.

6. A bipolar structure semiconductor device according to any one of claims, 1, 2, 3, 4 or 5, wherein said electrode is maintained at a potential equal to that of said control electrode area.

7. A bipolar structure semiconductor device according to any one of claims, 1, 2, 3, 4 or 5, wherein said electrode is maintained at a potential equal to that of said first main electrode area.

8. A bipolar structure semiconductor device according to any one of claims, 1, 2, 3, 4 or 5, wherein the thickness of said first main electrode area is smaller than a diffusion length of minority carriers which are injected from said control electrode area.

9. A bipolar structure semiconductor device according to any one of claims, 1, 2, 3, 4 or 5, wherein said electrode is used as a lead electrode of said control electrode area.

10. A bipolar structure semiconductor device according to any one of claims, 1, 2, 3, 4 or 5, wherein said first main electrode area is an emitter area.

11. A bipolar structure semiconductor device according to any one of claims, 1, 2, 3, 4 or 5, wherein said first conductive type is a p-type.

12. A bipolar structure semiconductor device according to any one of claims, 1, 2, 3, 4 or 5, wherein said second conductive type is n-type.

13. A bipolar structure semiconductor device according to any one of claims, 1, 2, 3, 4, or 5, wherein said electrode is formed between said control electrode area and said main electrode area.

14. A bipolar structure semiconductor device according to claim 13, wherein said first main electrode area is an emitter area.

15. A method for producing a bipolar type semiconductor device provided with a control electrode area composed of a semiconductor of a first conductive type and first and second main electrode areas positioned in contact with the control electrode area and composed of a semiconductor of a second conductive type different from the first conductive type, comprising the steps of:

forming an insulating layer on the control electrode area at least between the control electrode area and an area to be formed into the first main electrode area; and forming, by impurity injection, an electrode electrically connected at least to the control electrode area and the area to be formed into the first main electrode area through the insulating layer, wherein the electrode covers a surface of the control electrode area corresponding to a section at least between the control electrode area and the first main electrode area.

16. A method for producing a bipolar type semiconductor device provided with a control electrode area composed of a semiconductor of a first conductive type and first and second main electrode areas positioned in contact with the control electrode area and composed of a semiconductor of a second conductive type different from the first conductive type, comprising the steps of:

forming an insulating layer on the control electrode area at least between the control electrode area and an area to be formed into the first main electrode area; and forming, by impurity injection, an electrode electrically connected at least to the control electrode area and the area to be formed into the first main electrode area along the insulating layer provided on the electrode, wherein the electrode covers a surface of the control electrode area corresponding to a section at least between the control electrode and the first main electrode area, and wherein the electrode extends from an extracting electrode connected electrically to the control electrode area.

17. A method according to claim 15 or claim 16, wherein the first main electrode area is an emitter area.

18. A method according to claim 15 or claim 16, wherein the second conductive type is n-type.

19. A method according to claim 15 or claim 16, wherein the impurity injection is performed by an ion implantation process.

20. A bipolar structure semiconductor device provided with a control electrode area of a first conductivity type semiconductor, and first and second main electrode areas positioned in contact with said control electrode area and composed of a semiconductor of a second conductivity type different from the first conductivity type, comprising an electrode for controlling a surface state of said control electrode area, provided separately from an electrode electrically connected to said control electrode area through an insulating layer on said control electrode area at least between said control electrode area and said first main electrode area.

21. A bipolar structure semiconductor device according to claim 20, wherein said first main electrode area is an emitter area.

22. A bipolar structure semiconductor device according to claim 20, wherein said first conductivity type is p type.

23. A bipolar structure semiconductor device according to claim 20, wherein said second conductivity type is n type.

* * * * *

UNITED STATES PATENT AND TRADEMARK OFFICE
CERTIFICATE OF CORRECTION

PATENT NO. : 5,610,435
DATED : March 11, 1997
INVENTOR(S) : HIDENORI WATANABE ET AL.                  Page 1 of 3

It is certified that error appears in the above-indentified patent and that said Letters Patent is hereby corrected as shown below:

COLUMN 2

Line 37, "electrode" should read --electrodes--.

COLUMN 6

Line 27, "other" should read --another--.

COLUMN 12

Line 65, "$BV_{CEO} \equiv V_{NB=} 0.$" should read --$BV_{CEO} \equiv V_{NB=0}.$--.

COLUMN 14

Line 10, "filed" should read --field--.

COLUMN 16

Line 63, "shown" should read --shows--.

UNITED STATES PATENT AND TRADEMARK OFFICE
CERTIFICATE OF CORRECTION

PATENT NO. : 5,610,435
DATED : March 11, 1997
INVENTOR(S) : HIDENORI WATANABE ET AL.

It is certified that error appears in the above-indentified patent and that said Letters Patent is hereby corrected as shown below:

COLUMN 17

Line 49, "heated" should read --heat--.

COLUMN 19

Line 12, "plysilicon" should read --polysilicon--.

COLUMN 20

Line 18, "can" should read --can be--.

COLUMN 21

Line 50, "area" should read --area,--.

COLUMN 22

Line 2, "area" should read --area,--.

UNITED STATES PATENT AND TRADEMARK OFFICE
CERTIFICATE OF CORRECTION

PATENT NO. : 5,610,435
DATED : March 11, 1997
INVENTOR(S) : HIDENORI WATANABE ET AL.

It is certified that error appears in the above-indentified patent and that said Letters Patent is hereby corrected as shown below:

<u>COLUMN 24</u>

Line 23, "p type" should read --p-type--.
    Line 25, "n type" should read --n-type--.

Signed and Sealed this

Twenty-eighth Day of October, 1997

Attest:

BRUCE LEHMAN

Attesting Officer        Commissioner of Patents and Trademarks